(12) United States Patent
Wada

(10) Patent No.: US 6,834,376 B2
(45) Date of Patent: Dec. 21, 2004

(54) LOGIC OPTIMIZATION DEVICE FOR AUTOMATICALLY DESIGNING INTEGRATED CIRCUITS

(75) Inventor: Yasushi Wada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 48 days.

(21) Appl. No.: 10/212,768

(22) Filed: Aug. 7, 2002

(65) Prior Publication Data

US 2003/0061578 A1 Mar. 27, 2003

(30) Foreign Application Priority Data

Sep. 26, 2001 (JP) ........................................ 2001-294569

(51) Int. Cl.[7] .............................................. G06F 17/50
(52) U.S. Cl. ...................................... 716/2; 1/11; 1/12
(58) Field of Search ............................ 716/1, 2, 11, 12, 716/5, 6

(56) References Cited

U.S. PATENT DOCUMENTS 6,591,402 B1 * 7/2003 Chandra et al. ................ 716/5
6,618,834 B2 * 9/2003 Takeyama et al. .............. 716/2

FOREIGN PATENT DOCUMENTS

| JP | 1-205274 | 8/1989 |
| JP | 5-67171 | 3/1993 |
| JP | 10-171861 | 6/1998 |

* cited by examiner

Primary Examiner—Thuan Do
(74) Attorney, Agent, or Firm—Burns, Doane, Swecker & Mathis, L.L.P.

(57) ABSTRACT

A logic optimization device refers to hierarchical circuit-design descriptions representing multiple layers of an integrated circuit, and decides whether or not each output terminal at each lower layer is connected with its upper layer. If an output terminal at a lower layer has been decided to be unconnected with its upper layer, the logic optimization device deletes from the hierarchical circuit-design descriptions an information part describing the output terminal, and deletes from the hierarchical circuit-design descriptions an information part describing an element at the lower layer connected with the deleted output terminal, thereby producing a gate-level net-list of an integrated circuit without ineffectual elements.

9 Claims, 13 Drawing Sheets

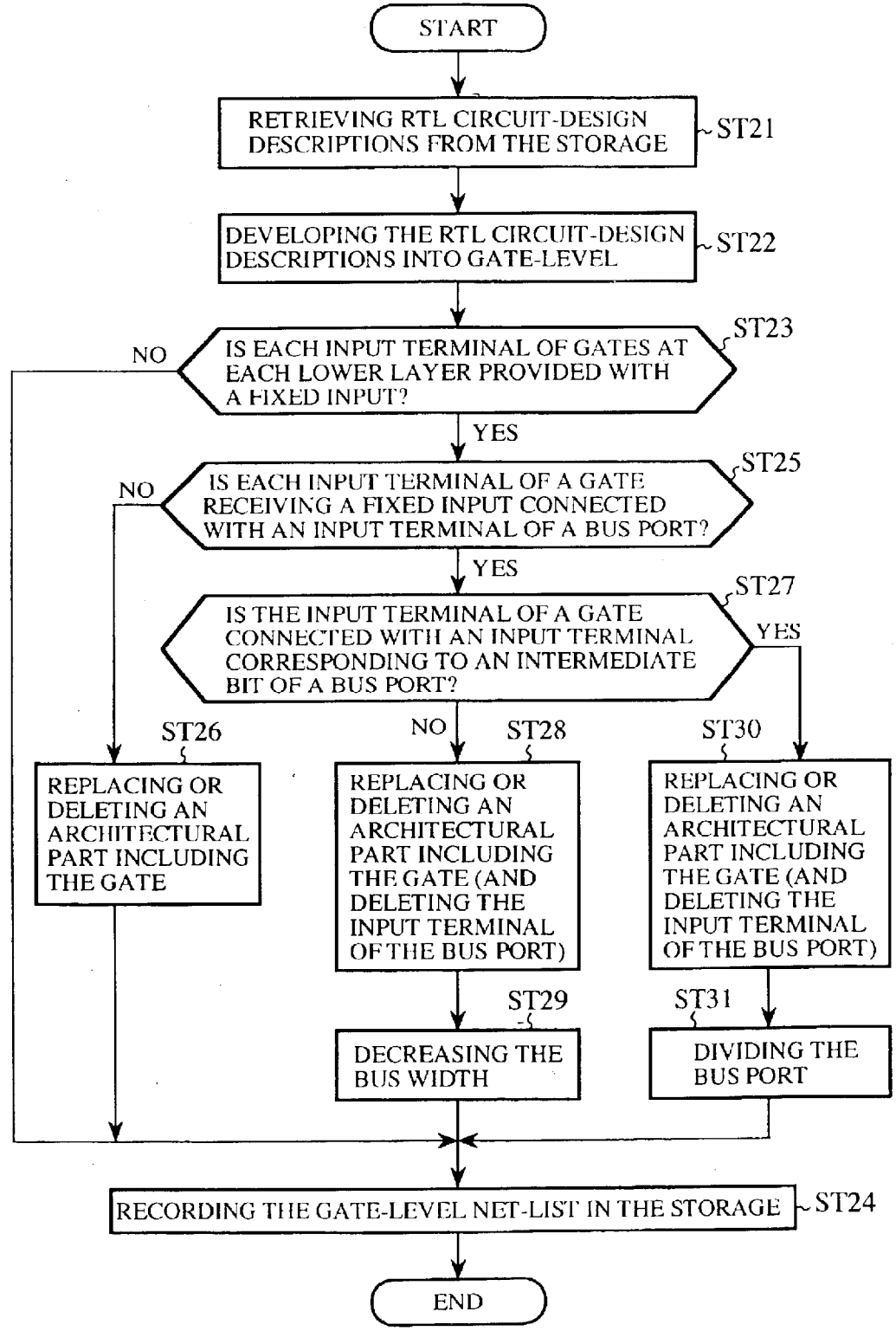

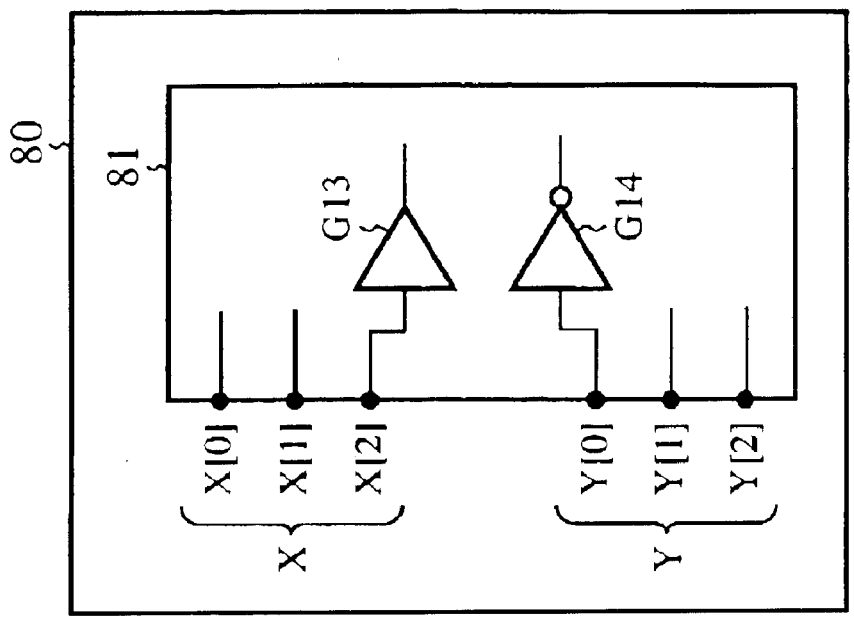
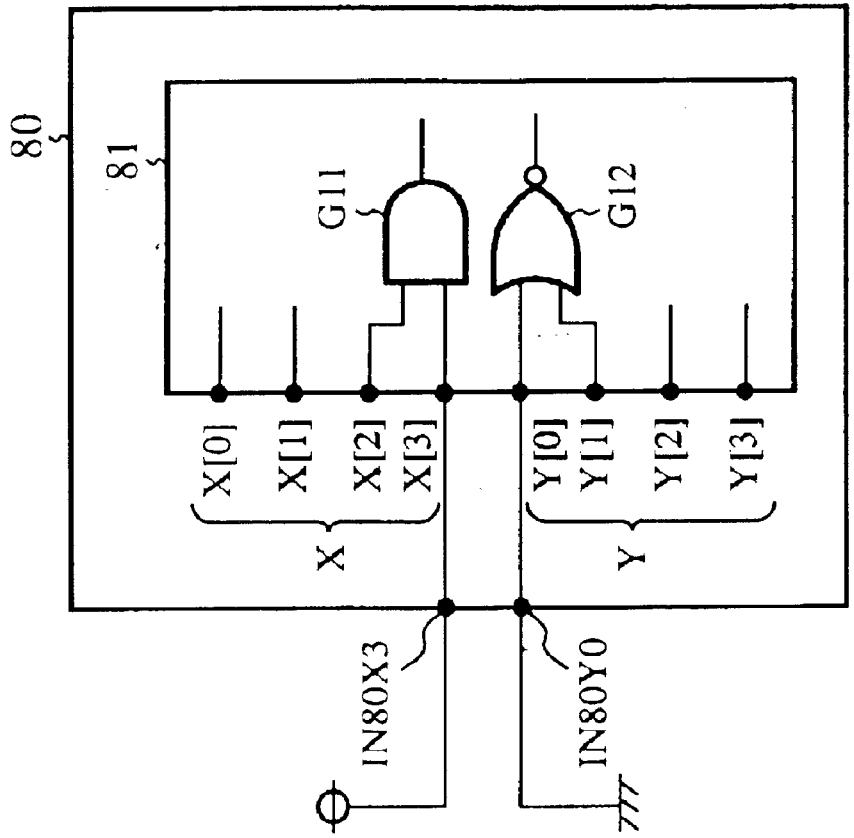

LOGIC OPTIMIZATION DEVICE FOR AUTOMATICALLY DESIGNING INTEGRATED CIRCUITS

BACKGROUND OF THE INVENTION

1. Field of the Invention

The present invention generally relates to a logic optimization device for automatically designing integrated circuits. More specifically, the present invention relates to a logic optimization device for deleting an unnecessary output port, thereby producing a consistent hierarchical gate-level net-list.

2. Description of Background Art

In a method for designing a hierarchical integrated circuit, a plurality of circuit-design descriptions representing a multi-layered blocks of the hierarchical integrated circuit are first prepared in RTL (register transfer level). Then, the plurality of RTL circuit-design descriptions are subject to a logic synthesis, and are assembled to a net-list in gate-level (logic circuit level).

In another method, a final gate-level net-list of a whole hierarchical integrated circuit including a multi-layered blocks is generated on the basis of a plurality of componential gate-level net-lists each of which represents a respective layer.

In such design methods, each circuit-design description or each componential net-list is frequently prepared such that the corresponding layer block includes superfluous elements in order that this layer can be utilized for plurality sorts of upper layer blocks. In this case, the lower layer block inevitably includes one or more elements that are not used for an individual upper layer block.

When a logic synthesis is executed on circuit-design descriptions of such a lower layer block having superfluous elements and a upper layer block, the final net-list of the whole integrated circuit also prescribes one or more redundant output terminals and logics that are not used for the upper layer block. Accordingly, there is likelihood that one or more unnecessary circuits are left in the final net-list. The same problem occurs when a final gate-level net-list of a whole hierarchical integrated circuit is assembled from a componential gate-level net-list describing a lower layer block including superfluous elements and another componential gate-level net-list describing an upper layer block.

Accordingly, some conventional logic optimization device can deletes redundant logics relevant to output terminals that are not connected to elements at their upper layer block when such output terminals are indicated by a human designer at the logic synthesis process.

However, with respect to such a conventional logic optimization device, the designer should know in advance the unnecessary output terminals that are not connected with elements in their upper layer block in order to exclude redundant elements.

Furthermore, when a plurality of the same lower layer blocks are connected with an upper layer block, but the lower layer blocks have different output terminals that are not connected with the upper layer block, the above-described method will be complicated.

Additionally, a similar problem arises if a constant or fixed input is given to an input terminal of a gate at a lower layer from an upper layer. In such a case, an architectural part including the gate at the lower layer and some element at the upper layer may be deleted or replaced with a simpler architectural part since a constant input is given to the input terminal of the gate. However, there has not been an idea for replacing or deleting such an architectural part over a plurality of layers, so that unnecessary elements are left in the final net-list.

SUMMARY OF THE INVENTION

It is therefore an object of the present invention to provide a logic optimization device for simplifying elements in multiple layers of a hierarchical integrated circuit automatically, thereby producing a wasteless hierarchical gate-level net-list.

In accordance with an aspect of the present invention, a logic optimization device includes a decider for referring to hierarchical circuit-design descriptions representing multiple layers of an integrated circuit, and for deciding whether or not each output terminal at each lower layer is connected with its upper layer. The logic optimization device also includes a modifier for deleting from the hierarchical circuit-design descriptions an information part describing an output terminal at a lower layer that has been decided to be unconnected with its upper layer by the decider, and for deleting from the hierarchical circuit-design descriptions an information part describing an element at the lower layer connected with the output terminal, thereby producing a gate-level net-list of an integrated circuit.

With such a structure, it is possible to delete unnecessary elements at each layer of a hierarchical integrated circuit automatically, thereby producing a wasteless hierarchical gate-level net-list.

In accordance with another aspect of the present invention, a logic optimization device includes a decider for referring to hierarchical circuit-design descriptions representing multiple layers of an integrated circuit, and deciding whether or not each gate at each lower layer receives a fixed input from its upper layer. The logic optimization device also includes a modifier for replacing in the hierarchical circuit-design descriptions information parts describing an original architectural part including elements at a lower layer including a gate that has been decided to receive a fixed input by the decider and elements at its upper layer connected to an input terminal of the gate by alternative information parts describing an equivalent architectural part that is simpler than the original architectural part, or for deleting from the hierarchical circuit-design descriptions information parts describing the original architectural part, thereby producing a gate-level net-list of an integrated circuit.

With such a structure, it is also possible to delete unnecessary elements at each layer of a hierarchical integrated circuit automatically, thereby producing a wasteless hierarchical gate-level net-list.

BRIEF DESCRIPTION OF THE DRAWINGS

With reference to the accompanying drawings, various embodiments of the present invention will be described hereinafter. In the drawings.

FIG. 11 is a flow chart of a process executed by a logic optimization device according to a fifth embodiment of the present invention;

FIG. 12A is a diagram of a hierarchical integrated circuit based on a gate-level net-list prepared on the basis of circuit-design descriptions representing multiple layers of the circuit in RTL, without a modification process of the fifth embodiment;

FIG. 12B is a diagram of a hierarchical integrated circuit based on a gate-level net-list prepared by the logic optimization device of the fifth embodiment on the basis of the same circuit-design descriptions in RTL that are the bases of FIG. 12A;

DETAILED DESCRIPTION OF PREFERRED EMBODIMENTS

First Embodiment.

Figure 1:
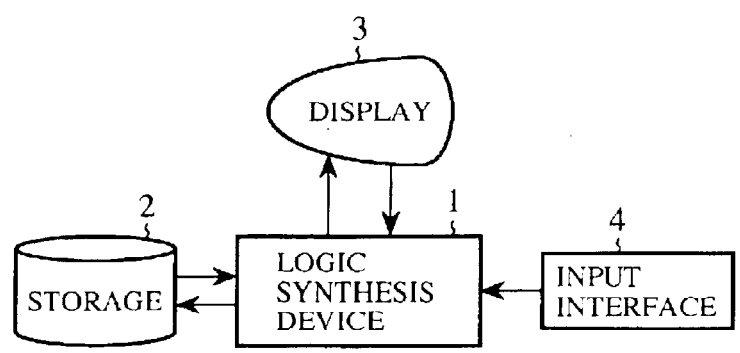
FIG. 1 is a block diagram showing a logic optimization device according to a first embodiment of the present invention.

FIG. 1 is a block diagram showing a logic optimization device according to a first embodiment of the present invention. As shown in FIG. 1, the logic optimization device comprises a logic synthesis device 1 (used as a decider, a modifier, and a second decider), a storage 2, a display 3, and an input interface 4.

Next, operations will be described. In a preferable embodiment, the logic synthesis device 1 may be a computer operating on the basis of software, and applies a logic synthesis to circuit-design descriptions, each of which represents a respective layer of a hierarchical integrated circuit in RTL, thereby producing a net-list of the whole hierarchical integrated circuit described in gate-level.

The storage 2 stores circuit-design descriptions represented in RTL. In addition, when the logic synthesis device 1 produces a net-list of an entire integrated circuit, the logic synthesis device 1 stores the storage 2 with the net-list. In alternative embodiments, the logic synthesis device 1 may record a net-list, which is produced by the logic synthesis device 1, in a storage medium different from the storage 2 or may send such a net-list to another device via a communication device although these embodiments are not shown.

The logic synthesis device 1 also controls the display 3 on the basis of the produced net-list, so that the display 3 exhibits a circuit diagram of the integrated circuit corresponding to the net-list. Using the input interface 4, a human designer may give an instruction to the logic synthesis device 1 to commence the logic synthesis. Upon receiving the instruction, the logic synthesis device 1 reads RTL circuit-design descriptions, which are necessary for producing an end-product integrated circuit, from the input interface 4, and executes the logic synthesis on the RTL circuit-design descriptions.

In the logic synthesis, the logic synthesis device 1 develops the RTL circuit-design descriptions into gate-level. Then, the logic synthesis device 1 decides whether or not each output terminal at each lower layer is connected with an element in its upper layer with respect to the developed circuit-design descriptions for logic alignment. If there is an output terminal at a lower layer that is not connected with an upper layer element, the logic synthesis device 1 deletes from the developed circuit-design descriptions the information part describing the redundant output terminal at the lower layer as well as information parts describing lower layer elements connected with the redundant output terminal, thereby producing a gate-level net-list of the end-product integrated circuit without ineffectual elements.

Figure 2:
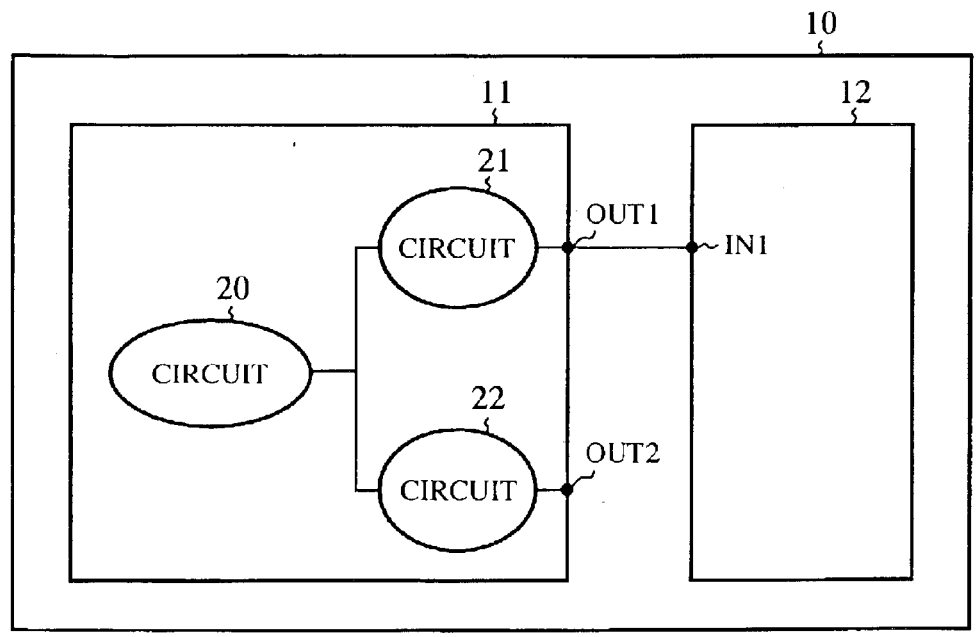
FIG. 2 is a diagram of a hierarchical integrated circuit based on a gate-level net-list prepared on the basis of circuit-design descriptions representing multiple layers of the circuit in RTL, without a modification process of the first embodiment.
Figure 3:
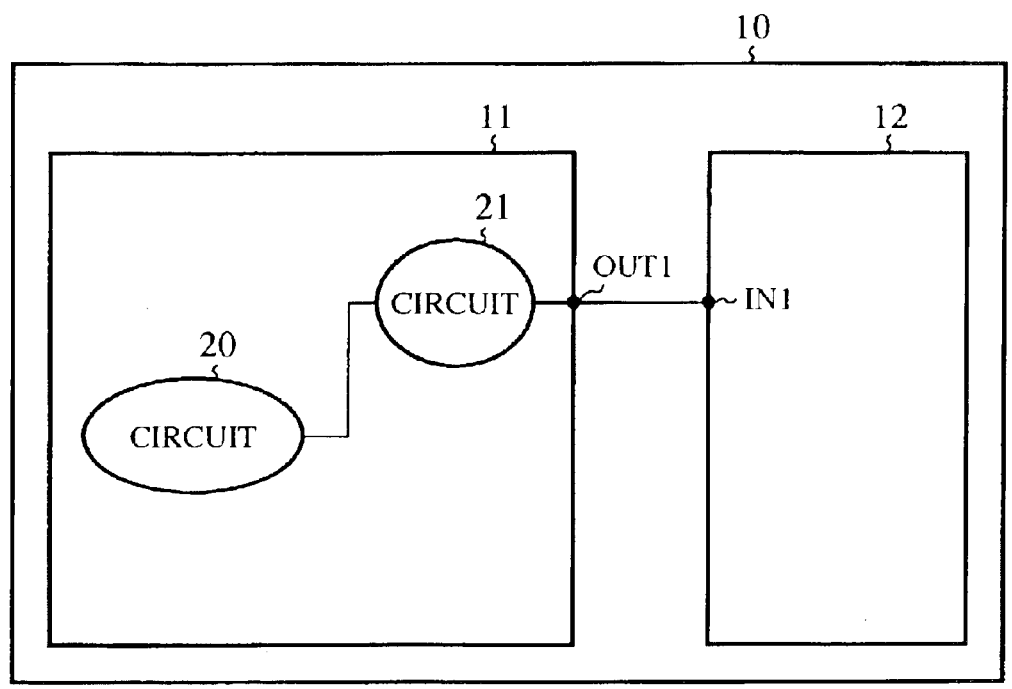
FIG. 3 is a diagram of a hierarchical integrated circuit based on a gate-level net-list prepared by the logic optimization device of the first embodiment on the basis of the same circuit-design descriptions in RTL that are the bases of FIG. 2.

Referring now to FIGS. 2 and 3, a process carried out by the logic optimization device according to the first embodiment of the present invention will be described in more detail. In FIGS. 2 and 3, reference numeral 10 designates a block at a layer in an end-product hierarchical integrated circuit.

Blocks 11 and 12 are located at the nearest layer beneath the layer where the block 10 is located. Reference numerals 20, 21, and 22 denote circuits at the block 11 while OUT1 and OUT2 designate output terminals of the block 10. The block 12 is provided with an input terminal IN1.

FIG. 2 illustrates a hierarchical integrated circuit based on a gate-level net-list prepared on the basis of RTL circuit-design descriptions representing multiple layers of the circuit, without a modification process of the first embodiment. As shown in FIG. 2, there are circuits 20, 21, and 22 within the block 11 at the lower layer beneath the block 10. This means that the RTL circuit-design description for the layer of the block 11 provided for the logic synthesis describes that the block 11 has three circuits 20, 21, and 22. The circuits 21 and 22 are connected with the circuit 20 in such a manner that the output of the circuit 20 is supplied to the circuits 21 and 22.

The circuit 21 is connected with the output terminal OUT1 of the block 11 so that the output of the circuit 21 can be supplied from the output terminal OUT1 to a suitable circuit if the suitable circuit is connected with the output terminal OUT1. The output terminal OUT1 is connected with the input terminal IN1 of the block 12 located at the same layer of the block 11. The block 12 is connected to the block 10 at the upper layer of the block 12 although particulars of the connection are not illustrated. Accordingly, the output of the circuit 21 can be supplied to the block 10 at the upper layer.

On the other hand, the circuit 22 is connected with the output terminal OUT2 of the block 11. If a suitable circuit is connected with the output terminal OUT2, the output of the circuit 22 can be supplied from the output terminal OUT2 to such a suitable circuit. However, the output terminal OUT2 is not connected with any other signal line. Accordingly, the circuit 22 is unnecessary for the block 10 at the upper layer.

FIG. 3 shows a hierarchical integrated circuit based on a gate-level net-list prepared by the logic synthesis device 1 of the first embodiment on the basis of the same RTL circuit-design descriptions that are the bases of FIG. 2. In this embodiment, as shown in FIG. 3, the circuit 22 is deleted from the block 11 and the output terminal OUT2 connected with the circuit 22 is also deleted. More exactly, the logic synthesis device 1 deletes information parts describing the circuit 22 and output terminal OUT2 from the circuit-design descriptions developed in gate-level, and produces a hierarchical gate-level net-list on the whole end-product integrated circuit. Thus, the volume and the area of the end-product circuit can be decreased.

As described above, by virtue of the first embodiment, it is possible to delete unnecessary elements at each layer of a hierarchical integrated circuit automatically, thereby producing a wasteless hierarchical gate-level net-list.

Second Embodiment.

Next, a logic optimization device according to a second embodiment of the present invention will be described. The structure of the logic optimization device according to the second embodiment may be the same as that illustrated in FIG. 1.

Figure 4:
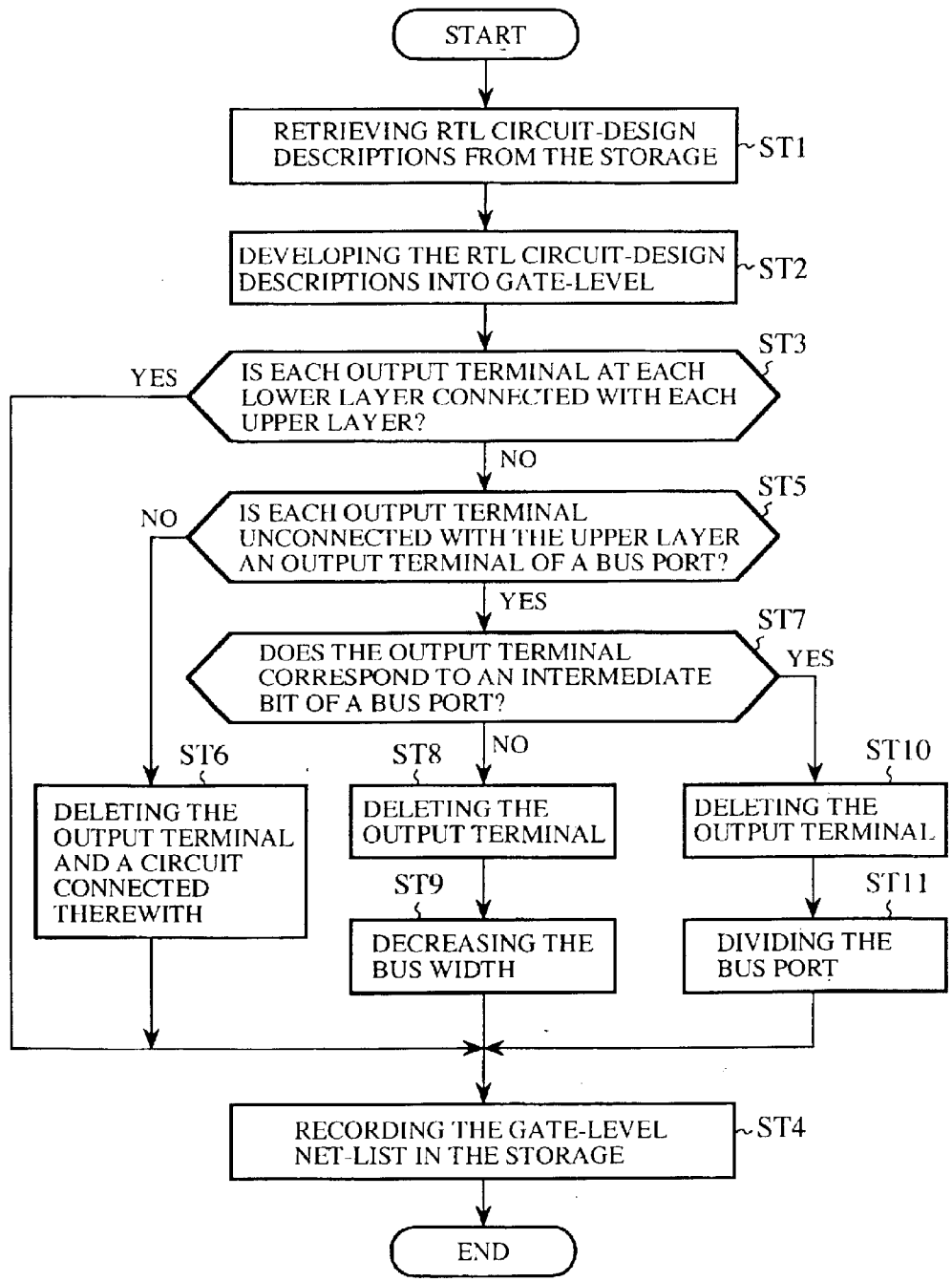
FIG. 4 is a flow chart of a process executed by a logic optimization device according to a second embodiment of the present invention.

Next, operations will be described. FIG. 4 is a flow chart of a process executed by the logic synthesis device 1 (see FIG. 1) of the logic optimization device according to the second embodiment of the present invention. The process starts once a human designer, using the input interface 4, gives the logic synthesis device 1 an instruction to start logic synthesis.

When the instruction is given, the logic synthesis device 1 retrieves from the storage 2 RTL circuit-design descriptions relevant to the end-product integrated circuit at step ST1. Next, at step ST2, the logic synthesis device 1 develops the RTL circuit-design descriptions into gate-level. Then, at step ST3, the logic synthesis device 1 decides whether or not each output terminal at each lower layer is connected with an element at each upper layer with respect to the developed circuit-design descriptions for logic alignment.

If each output terminal at each lower layer is connected with an element at each upper layer, the decision at step ST3 is affirmative. In this case, since a wasteless hierarchical gate-level net-list may be produced without any further proceeding, the process proceeds to step ST4 wherein the logic synthesis device 1 records the gate-level net-list in the storage 2, and then the process ends.

However, if any output terminal at any lower layer is not connected with an element at its upper layer, the decision at step ST3 is negative. In this case, at step ST5, the logic synthesis device 1 decides whether or not each output terminal unconnected with its upper layer is an output terminal belonging to a bus port of a block or device at the lower layer.

If the decision at step ST5 is negative, the process proceeds to step ST6 wherein the logic synthesis device 1 deletes information parts describing the output terminal and a circuit connected with the output terminal in the same layer from the circuit-design descriptions developed in gate-level, in a manner similar to that explained in conjunction with the first embodiment. Next, the process proceeds to step ST4 wherein the logic synthesis device 1 records the gate-level net-list without redundancy in the storage 2, and then the process ends.

However, the decision at step ST5 is affirmative if any output terminal unconnected with its upper layer is an output terminal of a bus port of a block or device of the lower layer. In this case, the process proceeds to step ST7 wherein the logic synthesis device 1 decides whether or not each output terminal of a bus port, which is unconnected with its upper layer, is an output terminal corresponding to an intermediate bit (other than the most significant or least significant bit) of the bus port.

The decision at step ST7 is negative if any output terminal unconnected with its upper layer corresponds to the most significant or least significant bit of a bus port. The decision at step ST7 is also negative if a plurality of output terminals unconnected with their upper layer correspond to consecutive bits including the most significant or least significant bit of a bus port. In these cases, the logic synthesis device 1 deletes the information part(s) describing the redundant output terminal(s) at the lower layer at step ST8. Furthermore, at step ST9, the logic synthesis device 1 produces a gate-level net-list wherein the name of the bus port is not changed, but the bus width is decreased for the deleted output terminal(s). Proceedings at steps ST8 and ST9 will be described in detail later. After step ST9, the process proceeds to step ST4 wherein the logic synthesis device 1 records the gate-level net-list without redundancy in the storage 2, and then the process ends.

The decision at step ST7 is affirmative if each output terminal of a bus port, which is unconnected with its upper layer, is an output terminal corresponding to an intermediate bit other than the most significant or least significant bit of the bus port. In this case, the logic synthesis device 1 also deletes the information part(s) describing the redundant output terminal(s) at the lower layer at step ST10.

Furthermore, at step ST11, the logic synthesis device 1 produces a gate-level net-list wherein the bus port involving the deleted output terminal(s) is divided into a plurality of bus ports at the deleted output terminal(s), and other output terminals are assigned to the separated bus ports. Proceedings at steps ST10 and ST11 will be described in detail later. After step ST11, the process proceeds to step ST4 wherein the logic synthesis device 1 records the gate-level net-list without redundancy in the storage 2, and then the process ends.

Figure 5B:
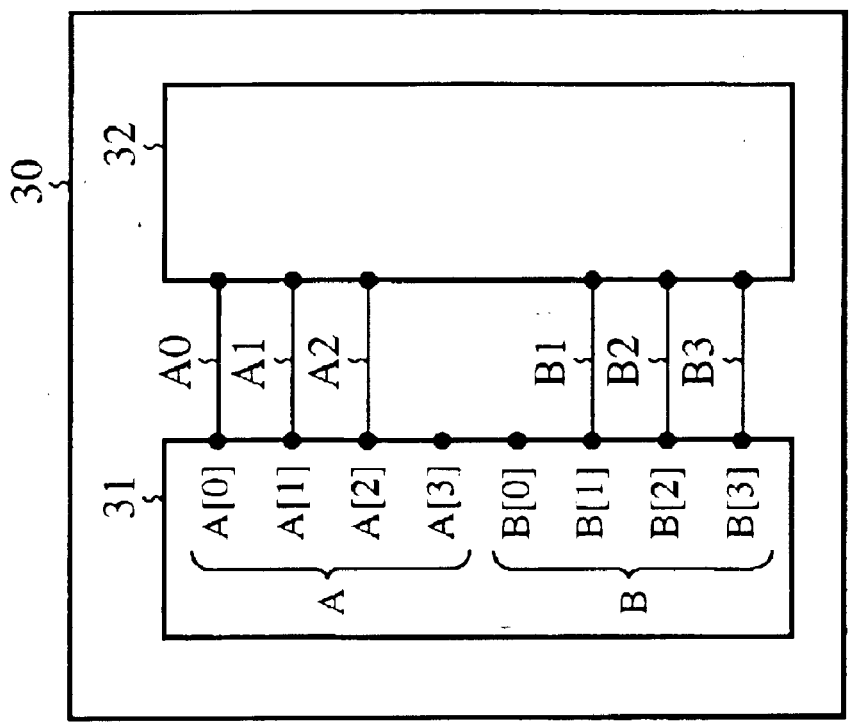
FIG. 5B is a diagram of a hierarchical integrated circuit based on a gate-level net-list prepared by the logic optimization device of the second embodiment on the basis of the same circuit-design descriptions in RTL that are the bases of FIG. 5A.
Figure 5A:
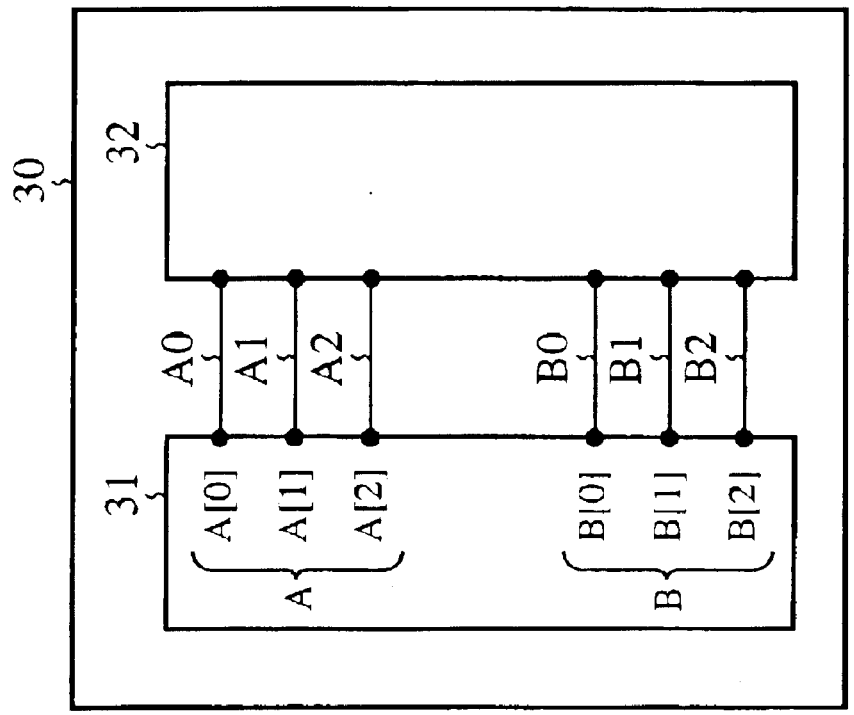
FIG. 5A is a diagram of a hierarchical integrated circuit based on a gate-level net-list prepared on the basis of circuit-design descriptions representing multiple layers of the circuit in RTL, without a modification process of the second embodiment.

Referring now to FIGS. 5A and 5B, the proceedings at steps ST8 and ST9 (FIG. 4) by the logic optimization device according to the second embodiment of the present invention will be described in more detail. In FIGS. 5A and 5B, reference numeral 30 designates a block at a layer in an end-product hierarchical integrated circuit.

Another block 32 is located at the nearest layer beneath the layer where the block 30 is located while still another block 31 is located at the nearest layer beneath the layer where the block 32 is located. The block 31 is provided with two output bus ports A and B, wherein the bus port A includes a plurality of output terminals A[3] through A[0] while the bus port B also includes a plurality of output terminals B[3] through B[0]. A2 through A0 and B3 through B0 denote lines connecting the block 31 and the upper block 32.

FIG. 5A illustrates a hierarchical integrated circuit based on a gate-level net-list prepared on the basis of RTL circuit-design descriptions representing multiple layers of the circuit, without a modification process of the second embodiment. The bus ports A and B are located at the block 31, which is lower than the blocks 30 and 32. As shown in FIG. 5A, the bus port A includes four output terminals A[3] through A[0] while bus port B also includes four output terminals B[3] through B[0]. Symbols "A" and "B" for the output terminals represent, for example, different uses of the output terminals. The bus port A including the output terminals A[3] through A[0] may have a different use of that of the bus port B including the output terminals B[3] through B[0].

The bus ports A and B correspond to parallel buses connecting the block 31 and the upper layer block 32. If all output terminals A[3] through A[0] are connected with the block 32 via lines, the bus constituted of the lines may be used for a 4-bit bus. Similarly, if all output terminals B[3] through B[0] are connected with the block 32 via lines, the bus constituted of the lines may be also used for a 4-bit bus.

However, the output terminal A[3] corresponding to the most significant bit among the output terminals A[3] through A[0] of the bus port A is not connected with a line. In addition, the output terminal B[0] corresponding to the least significant bit among the output terminals B[3] through B[0] of the bus port B is not connected with a line. Those output terminals A[3] and B[0] are unnecessary for the upper layer. Other output terminal A[2] through A[0] of the bus port A are connected with the block 32 via lines A2 through A0 comprising a parallel bus while the output terminals B[3] through B[1] of the bus port B are connected with lines B3 through B1 comprising another parallel bus.

FIG. 5B shows a hierarchical integrated circuit based on a gate-level net-list prepared by the logic synthesis device 1 of the second embodiment on the basis of the same RTL circuit-design descriptions that are the bases of FIG. 5A. In this embodiment, as shown in FIG. 5B, the output terminals A[3] and B[0] are deleted, and elements (not shown) within the block 31 connected with the output terminals A[3] and B[0] are also deleted if any. More exactly, the logic synthesis device 1 deletes the information parts describing the output terminals A[3] and B[0] from the circuit-design descriptions developed in gate-level, and information parts describing the elements (not shown) within the block 31, if any, connected with the output terminals A[3] and B[0]. This deletion is carried out at step ST8 in FIG. 4.

Thereafter, the logic synthesis device 1 produces a gate-level net-list wherein the names of the bus ports A and B are maintained unchanged, but the bus width of each bus is decreased for the deleted output terminals. This stage is step ST9 in FIG. 4. More specifically, as to the bus port A, the bus width of four bits corresponding to the output terminals A[3] through A[0] is decreased to three bits corresponding to the output terminal A[2] through A[0]. As to the bus port B, the bus width of four bits corresponding to the output terminals B[3] through B[0] is decreased to three bits corresponding to the output terminal B[2] through B[0]. At this stage, in the circuit-design description, while names of the output terminals of the bus port A are maintained unchanged, the logic synthesis device 1 changes names of the remaining output terminals of the bus port B: from B[3] to B[2], B[2] to B[1], and B[1] to B[0]. Thus, although unnecessary output terminals are deleted, the names of remaining output terminals of bus ports are prevented from being incoherent.

Figure 6A:
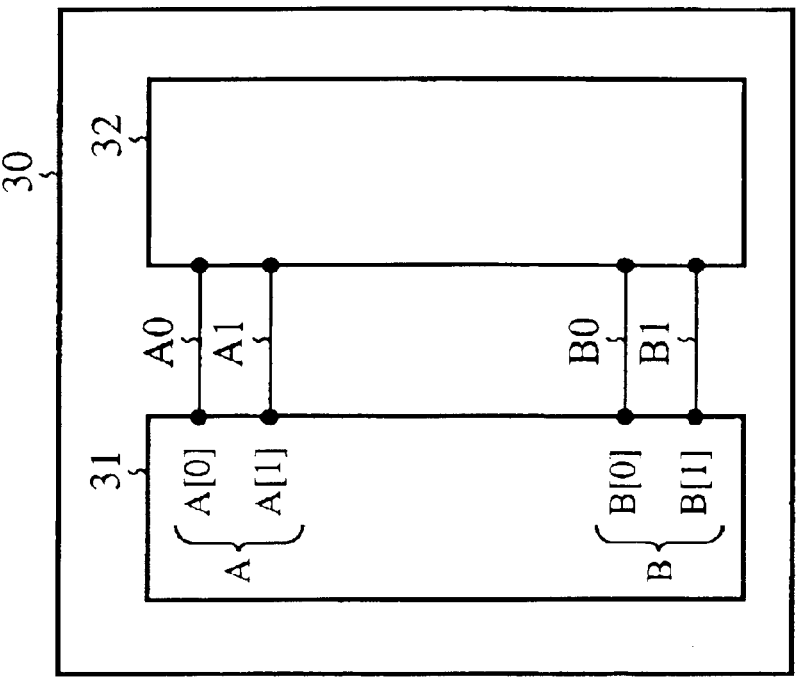
FIG. 6A is a diagram of a hierarchical integrated circuit based on a gate-level net-list prepared on the basis of circuit-design descriptions representing multiple layers of the circuit in RTL, without a modification process of the second embodiment.
Figure 6B:
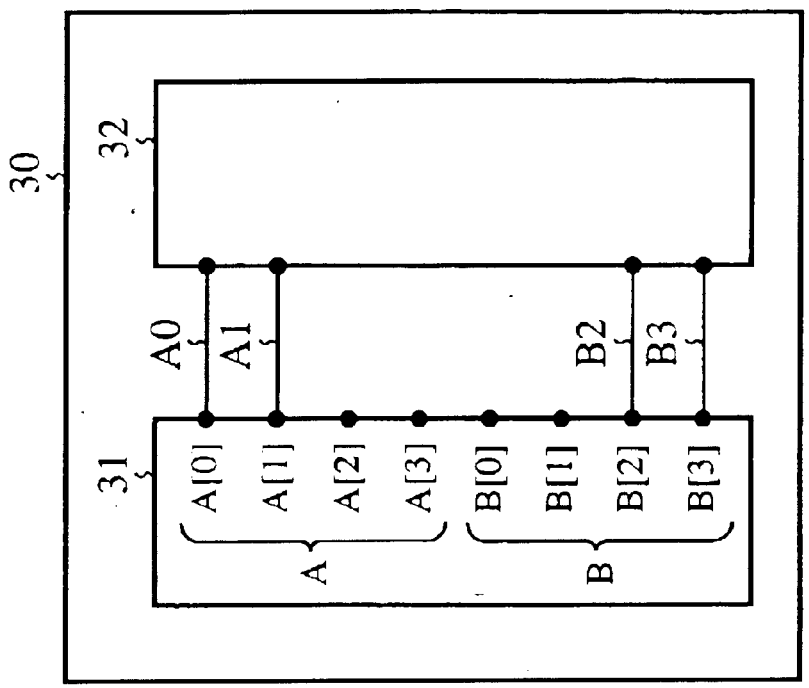
FIG. 6B is a diagram of a hierarchical integrated circuit based on a gate-level net-list prepared by the logic optimization device of the second embodiment on the basis of the same circuit-design descriptions in RTL that are the bases of FIG. 6A.

A similar proceeding is carried out when a plurality of output terminals unconnected with their upper layer correspond to consecutive bits including the most significant or least significant bit of a bus port. For example, if the output terminal A[2] is unnecessary in addition to the output terminal A[3] at the bus port A before the modification proceeding as shown in FIG. 6A, the logic synthesis device 1 deletes the information parts describing the output terminals A[3] and A[2] from the circuit-design descriptions developed in gate-level, and information parts describing elements (not shown) within the block 31, if any, connected with the output terminals A[3] and A[2]. Then, the logic synthesis device 1 decreases the bus width of four bits corresponding to the output terminals A[3] through A[0] to two bits corresponding to the output terminals A[1] and A[0] as shown in FIG. 6B.

If the output terminal B[1] is unnecessary in addition to the output terminal B[0] at the bus port B before the modification proceeding as shown in FIG. 6A, the logic synthesis device 1 deletes the information parts describing the output terminals B[0] and B[1] from the circuit-design descriptions developed in gate-level, and information parts describing elements (not shown) within the block 31, if any, connected with the output terminals B[0] and B[1]. Then, the logic synthesis device 1 decreases the bus width of four bits corresponding to the output terminals B[3] through B[0] to two bits corresponding to the output terminals B[1] and B[0] as shown in FIG. 6B. At this stage, the logic synthesis device 1 changes names of the remaining output terminals of the bus port B: from B[3] to B[1], and B[2] to B[0].

Figure 7A:
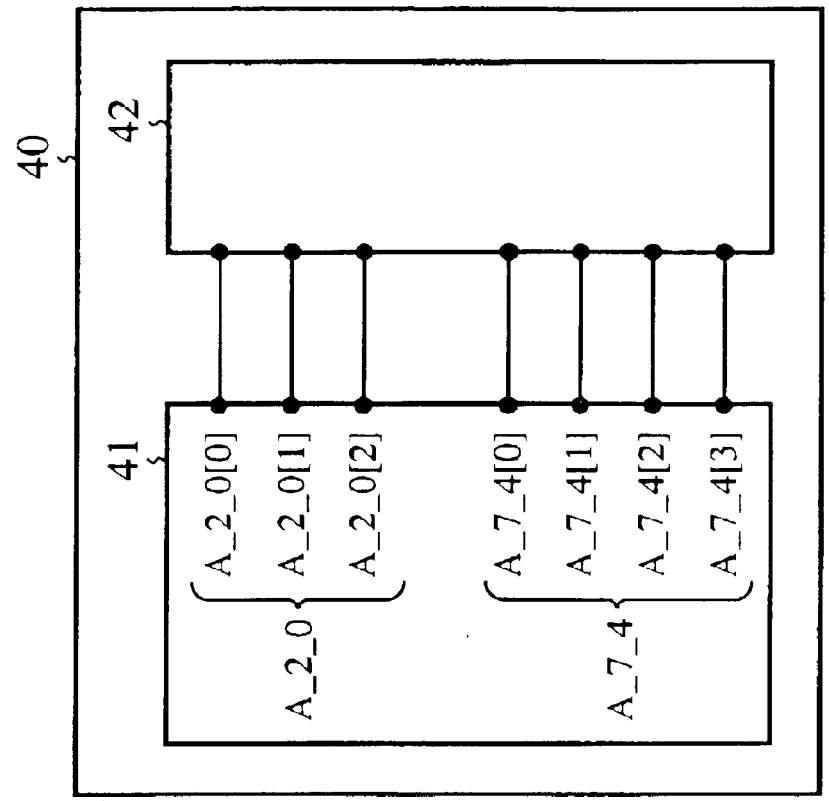
FIG. 7A is a diagram of another hierarchical integrated circuit based on a gate-level net-list prepared on the basis of other circuit-design descriptions representing multiple layers of the circuit in RTL, without a modification process of the second embodiment.
Figure 7B:
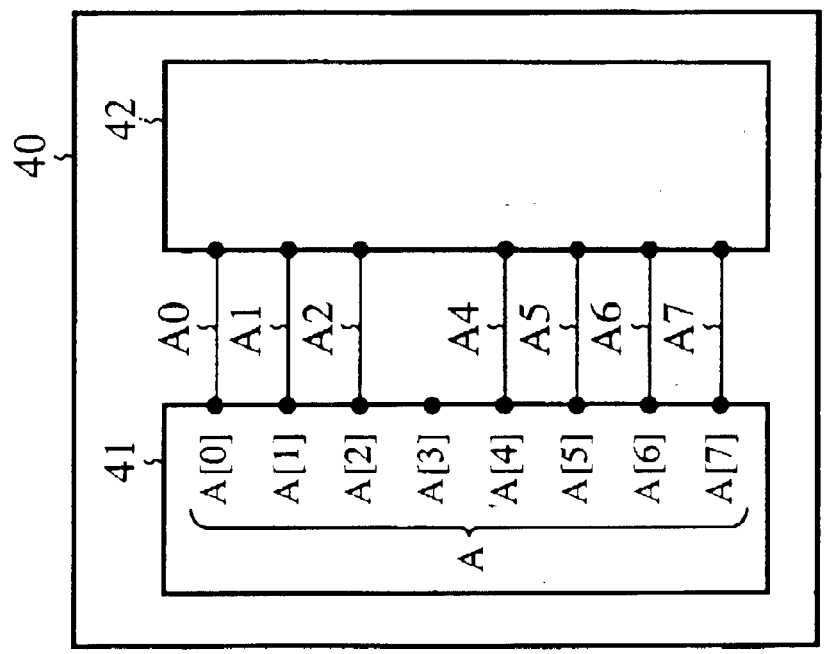
FIG. 7B is a diagram of a hierarchical integrated circuit based on a gate-level net-list prepared by the logic optimization device of the second embodiment on the basis of the same circuit-design descriptions in RTL that are the bases of FIG. 7A.

Referring now to FIGS. 7A and 7B, the proceedings at steps ST10 and ST11 (FIG. 4) by the logic optimization device according to the second embodiment of the present invention will be described in more detail. In FIGS. 7A and 7B, reference numeral 40 designates a block at a layer in an end-product hierarchical integrated circuit.

Another block 42 is located at the nearest layer beneath the layer where the block 40 is located while still another block 41 is located at the nearest layer beneath the layer where the block 42 is located. The block 41 is provided with an output bus port A, wherein the bus port A includes a plurality of output terminals A[7] through A[0]. The block 41 is connected with the upper block 42 via a plurality of lines A7 through A4 and A2 through A0.

FIG. 7A illustrates a hierarchical integrated circuit based on a gate-level net-list prepared on the basis of RTL circuit-design descriptions representing multiple layers of the circuit, without the modification process of the second embodiment. The bus port A is located at the block 41, which is lower than the blocks 40 and 42. As shown in FIG. 7A, the bus port A includes eight output terminals A[7] through A[0].

The bus port A corresponds to a parallel bus connecting the block 41 and the upper layer block 42. If all output terminals A[7] through A[0] are connected with the block 42 via lines, the bus constituted of the lines is used for an 8-bit bus.

However, the output terminal A[3] corresponding to an intermediate bit among the output terminals A[7] through A[0] of the bus port A is not connected with a line. The output terminal A[3] is unnecessary for the upper layer. Other output terminal A[7] through A[4] and A[2] through A[0] of the bus port A are connected with the block 42 via line A7 through A4 and A2 through A0 comprising a parallel bus.

FIG. 7B shows a hierarchical integrated circuit based on a gate-level net-list prepared by the logic synthesis device 1 of the second embodiment on the basis of the same RTL circuit-design descriptions that are the bases of FIG. 7A. In this embodiment, as shown in FIG. 7B, the output terminal A[3] is deleted, and elements (not shown) within the block 41 connected with the output terminal A[3] are also deleted if any. More exactly, the logic synthesis device 1 deletes the information part describing the output terminal A[3] from the circuit-design descriptions developed in gate-level, and information part describing the elements (not shown) within the block 41, if any, connected with the output terminal A[3]. This deletion is carried out at step ST10 in FIG. 4.

Furthermore, the logic synthesis device 1 produces a gate-level net-list wherein the bus port A involving the deleted output terminals A[3] is divided into two bus ports A_2_0 and A_7_4 at the deleted output terminal A[3], and other terminals A[7] through A[4] and A[2] through A[0] are assigned to the separated bus ports A_7_4 and A_2_0. The bus port A_2_0 is a 3-bit port wherein the output terminal A[2] in FIG. 7A is the most significant bit while the output terminal A[0] is the least significant bit. The bus port A_7_4 is a 4-bit port wherein the output terminal A[7] in FIG. 7A is the most significant bit while the output terminal A[4] is the least significant bit. This stage is step ST11 in FIG. 4.

On account of the bus port division, the logic synthesis device 1 changes the names of the output terminals as shown in FIG. 7B. More specifically, names A[2] through A[0] are changed to A_2_0[2] through A_2_0[0] while names A[7] through A[4] are changed to A_7_4[3] through A_7_4[0]. Thus, although unnecessary output terminals are deleted, the names of remaining output terminals of bus ports are prevented from being incoherent. Furthermore, the names of output terminals can be changed easily and the previous names in the original circuit-design description can be readily assumed from the new names of the output terminals.

While the original bus port A is divided into two bus ports A_2_0 and A_7_4 in the above-described example, the bus port A may be divided into three or more bus ports in accordance with a similar manner if deleted are a plurality of output terminals corresponding to intermediate bits in the original bus port A.

As described above, by virtue of the second embodiment, it is possible to delete unnecessary elements at each layer of a hierarchical integrated circuit automatically, thereby producing a wasteless hierarchical gate-level net-list. Furthermore, although unnecessary output terminals are deleted, the names of remaining output terminals of bus ports are prevented from being incoherent.

Third Embodiment.

Next, a logic optimization device according to a third embodiment of the present invention will be described. The structure of the logic optimization device according to the third embodiment may be also the same as that illustrated in FIG. 1.

Next, operations will be described. The logic optimization device according to the third embodiment carries out the following operations in addition to the same operations as those of the first embodiment.

The logic synthesis device 1 (see FIG. 1) of the logic optimization device decides whether or not each output terminal at each lower layer is connected with an element at each upper layer with respect to the developed circuit-design descriptions for logic alignment. In addition, although each output terminal at each lower layer is connected with an element of the nearest upper layer, the logic synthesis device 1 decides whether or not each output terminal at each lower layer is connected with an element at each secondary upper layer that is still upper than the nearest upper layer.

If there is an output terminal at a lower layer that is not connected with an element at the secondary upper layer, the logic synthesis device 1 deletes the information part describing the redundant output terminal at the lower layer as well as information parts describing the elements at the lower layer and nearest upper layer connected with the redundant output terminal.

Figure 8:
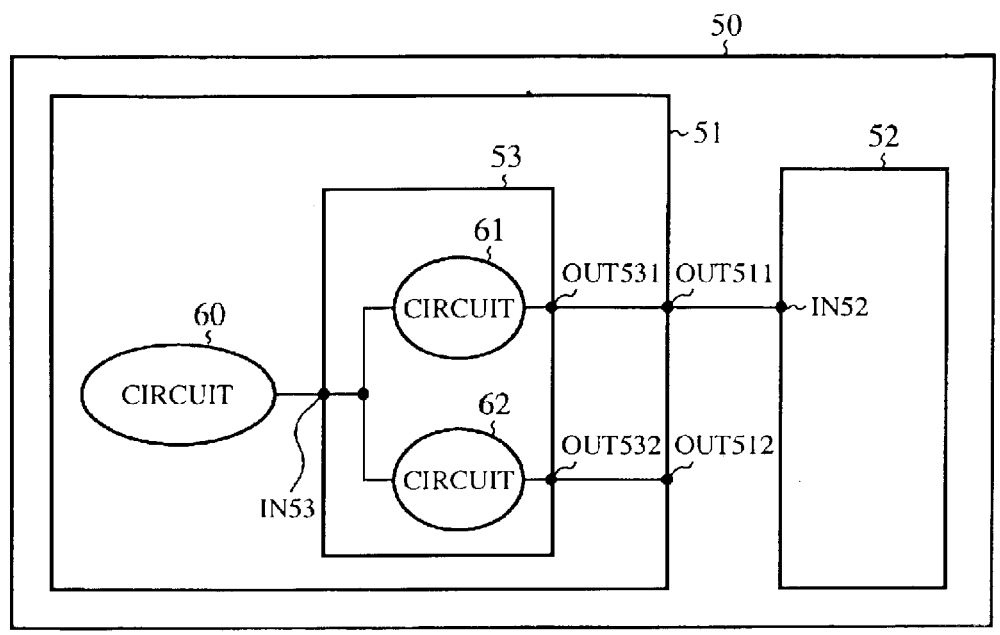
FIG. 8 is a diagram of a hierarchical integrated circuit based on a gate-level net-list prepared on the basis of circuit-design descriptions representing multiple layers of the circuit in RTL, without a modification process of a third embodiment of the present invention.
Figure 9:
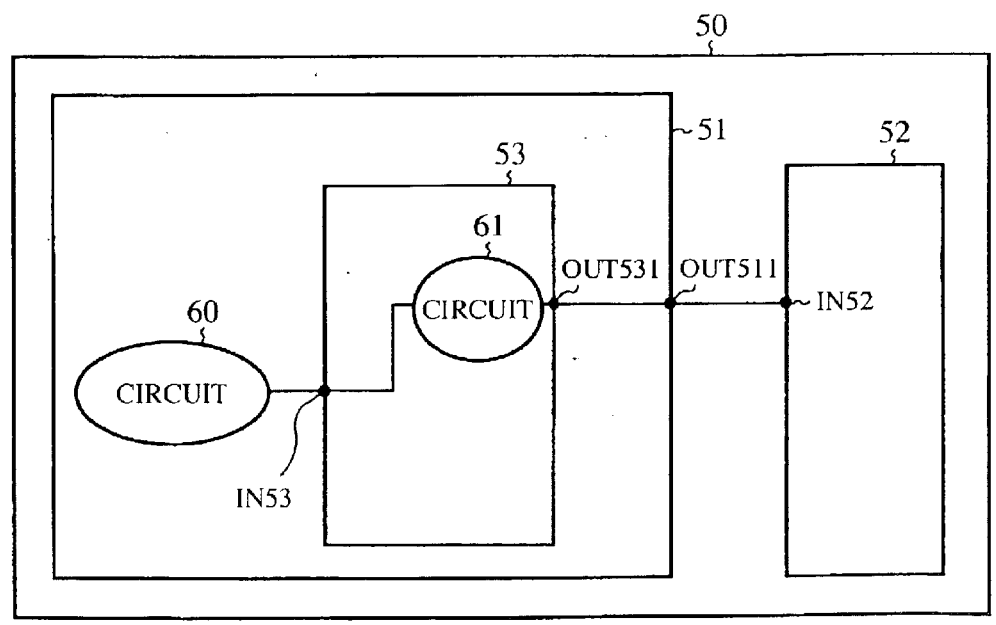
FIG. 9 is a diagram of a hierarchical integrated circuit based on a gate-level net-list prepared by the logic optimization device of the third embodiment on the basis of the same circuit-design descriptions in RTL that are the bases of FIG. 8.

Referring now to FIGS. 8 and 9, proceedings by the logic optimization device according to the third embodiment of the present invention will be described. In FIGS. 8 and 9, reference numeral 50 designates a block at a layer in an end-product hierarchical integrated circuit.

Blocks 51 and 52 are located at the nearest layer beneath the layer where the block 50 is located. A block 53 is located at the nearest layer beneath the layer where the blocks 51 and 52 are located. Consequently, as long as the illustrated blocks, the block 53 is located at the lowermost layer while the blocks 51 and 52 are located at the nearest upper layer for the block 53, and the block 50 is located at the secondary upper layer that is further upper than the blocks 51 and 52. The block 51 includes a circuit 60 while the block 53 includes circuits 61 and 62.

As shown in FIG. 8, the block 53 is provided with an input terminal IN53 and two output terminals OUT531 and OUT532. The block 51 is provided with two output terminals OUT511 and OUT512. The block 52 is provided with an input terminal IN52.

FIG. 8 illustrates a hierarchical integrated circuit based on a gate-level net-list prepared on the basis of RTL circuit-design descriptions representing multiple layers of the circuit, without a modification process of the third embodiment. As shown in FIG. 8, the lowermost layer block 53 includes circuits 61 and 62. This means that the RTL circuit-design description for the lowermost layer of the block 53 provided for the logic synthesis describes that the block 53 has two circuits 61 and 62.

The circuits 61 and 62 are connected with the input terminal IN53 of the block 53 that is connected with the circuit 60 within the block 51, so that the output of the circuit 60 is supplied to the circuits 61 and 62.

The circuit 61 is connected with the output terminal OUT531 of the block 53, which is connected with the output terminal OUT511 in the still upper layer block 51. Accordingly, the output of the circuit 61 can be supplied from the output terminal OUT511 to a suitable circuit if the suitable circuit is connected with the output terminal OUT511. The output terminal OUT511 is connected with the input terminal IN52 of the block 52 at the same layer as the block 51, and the block 52 is connected to the block 50 at the secondary upper layer although particulars of the connection are not illustrated. Accordingly, the output of the circuit 61 can be supplied to the block 50 of the secondary upper layer.

The circuit 62 is connected with the output terminal OUT532 of the block 53, which is connected with the output terminal OUT512 at the nearest upper layer block 51. Accordingly, if a suitable circuit is connected with the output terminal OUT512, the output of the circuit 62 is supplied from the output terminal OUT512 to the suitable circuit. However, the output terminal OUT512 is not connected with any signal line. Accordingly, the circuit 62 is unnecessary for the block 50 at the secondary upper layer.

FIG. 9 shows a hierarchical integrated circuit based on a gate-level net-list prepared by the logic synthesis device 1 (see FIG. 1) of the logic optimization device of the third embodiment on the basis of the same RTL circuit-design descriptions that are the bases of FIG. 8. In this embodiment, as shown in FIG. 9, the circuit 62 is deleted from the block 53, and the output terminal OUT532 connected with the circuit 62 is also deleted from the block 53. Furthermore, the output terminal OUT512 at the block 51 is deleted since it has become unnecessary. More exactly, the logic synthesis device 1 deletes the information parts describing the circuit 62 and output terminals OUT532 and OUT512 from the circuit-design descriptions developed in gate-level, and produces a hierarchical gate-level net-list on the whole end-product integrated circuit. Thus, the volume and the area of the end-product circuit can be decreased.

As described above, by virtue of the third embodiment, although each output terminal at each lower layer is connected with the nearest upper layer, it is decided whether or not each output terminal at each lower layer is connected with the secondary upper layer that is still upper than the nearest upper layer. Therefore, it is possible to delete a larger number of unnecessary elements at each layer of a hierarchical integrated circuit automatically, thereby producing a wasteless hierarchical gate-level net-list.

In the third embodiment, elements within the upper and secondary upper layer (blocks 51, 52 and 50), which is upper than the lower layer by two strata, are subject to the decision or inspection as to whether elements of the block 53 is connected or not. However, one or more still further layers may be subject to the decision. That is to say, although elements at the block 53 are connected with the block 50, a similar decision may be repeated as to whether or not elements at the block 53 are connected with elements at one or more still further layers if there are such layers above the block 50.

Furthermore, it is possible to design the logic optimization device of the third embodiment in such a manner that the logic optimization device can also carry out the same operations as those of the second embodiment.

Fourth Embodiment.

Next, a logic optimization device according to a fourth embodiment of the present invention will be described. The structure of the logic optimization device according to the fourth embodiment may be also the same as that illustrated in FIG. 1.

Next, operations will be described. Operations of the fourth embodiment may be incorporated with the above-described operations of any one of the first through third embodiments.

Once a human designer, using the input interface 4 (see FIG. 1), gives the logic synthesis device 1 an instruction to start logic synthesis, the logic synthesis device 1 retrieves from the storage 2 RTL circuit-design descriptions relevant to the end-product integrated circuit, and carries out the logic synthesis.

In the logic synthesis, the logic synthesis device 1 develops the RTL circuit-design descriptions into gate-level. Then, the logic synthesis device 1 decides whether or not each gate at each lower layer receives a constant or fixed input with respect to the developed circuit-design descriptions. If there is a gate at a lower layer that is provided with a constant input, the logic synthesis device 1 replaces information parts describing an architectural part comprising elements at the lower layer including the gate, which receives a constant input, and elements at its upper layer connected to an input terminal of the gate by alternative information parts describing an equivalent or similar architectural part that is simpler than the original architectural part, thereby producing a gate-level net-list of the end-product integrated circuit without ineffectual elements. Alternatively, the logic synthesis device 1 may delete the original information parts describing such an architectural part, thereby producing a simple gate-level net-list of the end-product integrated circuit.

Figure 10B:
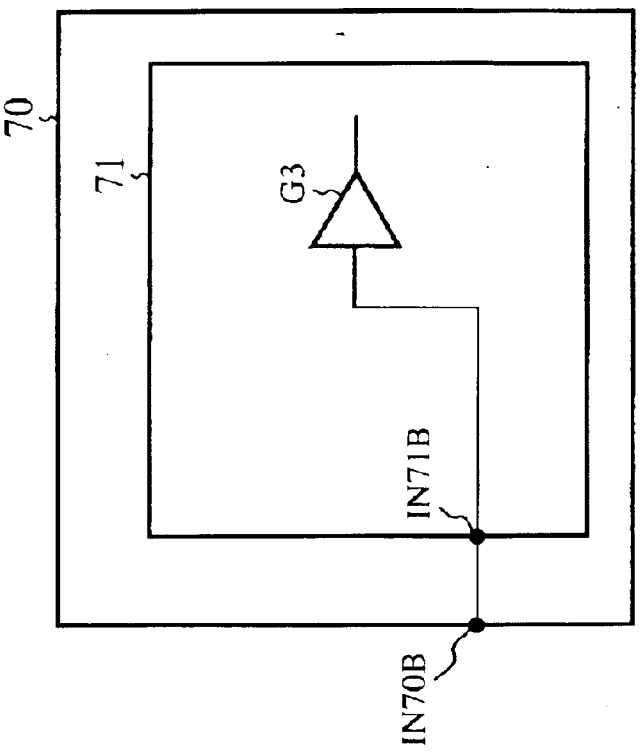
FIG. 10B is a diagram of a hierarchical integrated circuit based on a gate-level net-list prepared by the logic optimization device of the fourth embodiment on the basis of the same circuit-design descriptions in RTL that are the bases of FIG. 10A.
Figure 10A:
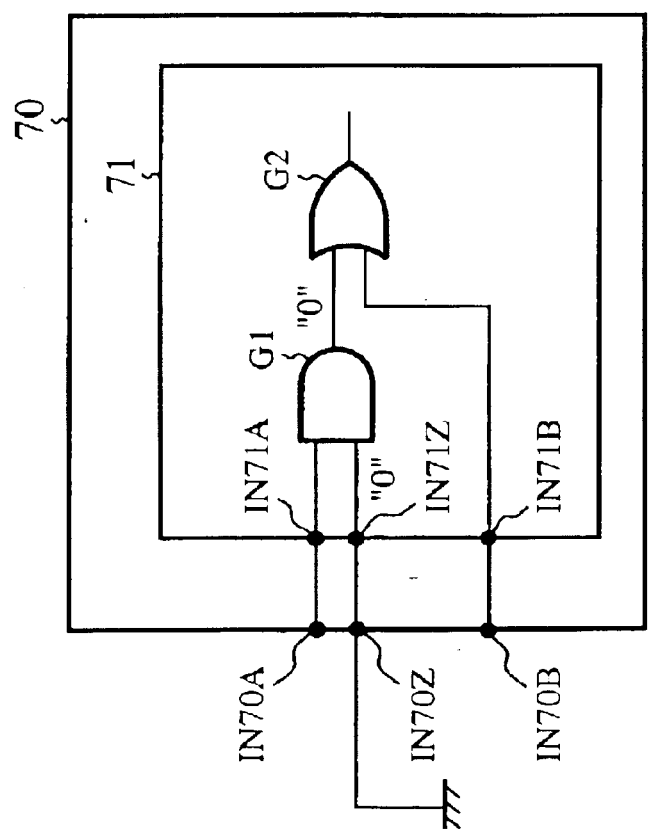
FIG. 10A is a diagram of a hierarchical integrated circuit based on a gate-level net-list prepared on the basis of circuit-design descriptions representing multiple layers of the circuit in RTL, without a modification process of a fourth embodiment of the present invention.

Referring now to FIGS. 10A and 10B, proceedings by the logic optimization device according to the fourth embodiment of the present invention will be described in more detail. In FIGS. 10A and 10B, reference numeral 70 designates a block at a layer in an end-product hierarchical integrated circuit. Another block 71 is located at the nearest layer beneath the layer where the block 70 is located. Symbols G1 and G2 denote AND gate and OR gate, which are located at the lower layer block 71, respectively. IN70A, IN70B, and IN70Z denote input terminals of the block 70 while IN71A, IN71B, and IN71Z denote input terminals of the block 71.

FIG. 10A illustrates a hierarchical integrated circuit based on a gate-level net-list prepared on the basis of RTL circuit-design descriptions representing multiple layers of the circuit, without a modification process of the fourth embodiment of the present invention. As shown in FIG. 10A, there are AND gate G1 and OR gate G2 at block 71 existing at the lower layer than the block 70. This means that RTL circuit-design description for the layer of the block 71 provided for the logic synthesis describes that the block 71 has these gates G1 and G2.

The input terminal IN70A, IN70B, and IN70Z at the upper layer block 70 are connected to the IN71A, IN71B, and IN71Z, respectively, that are located at the lower layer block 71. The input terminal IN71A and IN71Z are also connected with both input terminals of the AND gate G1, respectively. The output terminal of the AND gate G1 is connected with an input terminal of the OR gate G2 while the input terminal IN71B is connected with the other input terminal of the OR gate G2.

Let us assume that variable inputs (zero or one) may be supplied to the input terminals IN70A and IN70B while a fixed input "zero" is given to the input terminal IN70Z. In this case, irrespective of the variable input to the input terminal IN70A, the output of the AND gate G1 must be "zero." Accordingly, the OR gate G2, of which an input terminal is provided with the output of the AND gate G1, will output the same value as that is supplied via the other input terminal of the OR gate G2 from the input terminal IN71B. As will be understood by the above description, the AND gate G1 and OR gate G2 are unnecessary.

FIG. 10B shows a hierarchical integrated circuit based on a gate-level net-list prepared by the logic synthesis device 1 of the fourth embodiment on the basis of the same RTL circuit-design descriptions that are the bases of FIG. 10A. In this embodiment, as shown in FIG. 10B, the unnecessary AND gate G1 is removed from the block 71, and the input terminals IN70A, IN70Z, IN71A, and IN71Z, which are connected with the AND gate G1, are further removed.

The unnecessary OR gate G2 may be deleted from the block 71. However, the OR gate G2 is replaced with a buffer G3 and the input terminal of the buffer G3 is connected with the input terminal IN71B according to the illustrated embodiment.

More exactly, the logic synthesis device 1 deletes the information parts describing the AND gate G1, OR gate G2, and the input terminals IN70A, IN70Z, IN71A, and IN71Z from the circuit-design descriptions developed in gate-level. The logic synthesis device 1 also adds an information part describing the buffer G3 connected with the input terminal IN71B. The logic synthesis device 1 thus produces a hierarchical gate-level net-list on the whole end-product integrated circuit. Accordingly, the volume and the area of the end-product circuit can be decreased.

As described above, by virtue of the fourth embodiment, it is possible to delete unnecessary elements at each layer of a hierarchical integrated circuit automatically, thereby producing a wasteless hierarchical gate-level net-list.

Fifth Embodiment.

Next, a logic optimization device according to a fifth embodiment of the present invention will be described. The structure of the logic optimization device according to the fifth embodiment may be also the same as that illustrated in FIG. 1.

Next, operations will be described. Operations of the fifth embodiment may be incorporated with the above-described operations of any one of the first through third embodiments. FIG. 11 is a flow chart of a process executed by the logic synthesis device 1 (see FIG. 1) of the logic optimization device according to the fifth embodiment of the present invention. The process starts once a human designer, using the input interface 4, gives the logic synthesis device 1 an instruction to start logic synthesis.

When the instruction is given, the logic synthesis device 1 retrieves from the storage 2 RTL circuit-design descriptions relevant to the end-product integrated circuit at step ST21. Next, at step ST22, the logic synthesis device 1 develops the RTL circuit-design descriptions into gate-level. Then, at step ST23, the logic synthesis device 1 decides whether or not each input terminal of gates at each lower layer is provided with a fixed input from each upper layer with respect to the developed circuit-design descriptions for logic alignment.

If each input terminal of gates at each lower layer is not provided with a fixed input from each upper layer, the decision at step ST23 is negative. In this case, since a wasteless hierarchical gate-level net-list can be produced without any further proceeding, the process proceeds to step ST24 wherein the logic synthesis device 1 records the gate-level net-list in the storage 2, and then the process ends.

However, if any input terminal of gates at any lower layer is provided with a fixed input from its upper layer, the decision at step ST23 is affirmative. In this case, at step ST25, the logic synthesis device 1 decides whether or not each input terminal of a gate receiving a fixed input from the upper layer is connected with an input terminal of a bus port of a block or device of the lower layer.

If the decision at step ST25 is negative, the process proceeds to step ST26 wherein the logic synthesis device 1 replaces the information parts describing an architectural part including the lower layer gate(s) receiving a constant input by alternative information parts describing an equivalent, but simpler architectural part in the circuit-design descriptions developed in gate-level, or deletes the original information parts from the circuit-design descriptions developed in gate-level, in a manner similar to that explained in conjunction with the fourth embodiment. Then, the process proceeds to step ST24 wherein the logic synthesis device 1 records the gate-level net-list without redundancy in the storage 2, and then the process ends.

However, the decision at step ST25 is affirmative if each input terminal of a lower layer gate receiving a fixed input from the upper layer is connected with an input terminal of a bus port of a block or device of the lower layer. In this case, the process proceeds to step ST27 wherein the logic synthesis device 1 decides whether or not each input terminal of a gate, which receives a constant input from its upper layer, is connected with an input terminal corresponding to an intermediate bit (other than the most significant or least significant bit) of a bus port.

The decision at step ST27 is negative if any input terminal of a gate, which receives a constant input from its upper layer, is connected with an input terminal corresponding to the most significant or least significant bit of a bus port. In this case, the logic synthesis device 1 replaces the information parts describing an architectural part including the lower layer gate(s) receiving a constant input by alternative information parts describing an equivalent, but simpler architectural part in the circuit-design descriptions developed in gate-level, or deletes the original information parts from the circuit-design descriptions developed in gate-level at step ST28. At this stage, accompanied is the deletion of the information part describing the input terminal of the bus port corresponding to the most significant or least significant bit connected to the redundant gate.

Furthermore, at step ST29, the logic synthesis device 1 produces a gate-level net-list wherein the name of the bus port is not changed, but the bus width is decreased for the deleted input terminal(s). Proceedings at steps ST28 and ST29 will be described in detail later. After step ST29, the process proceeds to step ST24 wherein the logic synthesis device 1 records the gate-level net-list without redundancy in the storage 2, and then the process ends.

The decision at step ST27 is affirmative if the input terminal(s) of lower layer gate(s), which receives a constant input from its upper layer, is connected with an input terminal corresponding to an intermediate bit other than the most significant or least significant bit of a bus port. In this case, the logic synthesis device 1 also replaces the information parts describing an architectural part including the lower layer gate, which receives a constant input, by alternative information parts describing an equivalent, but simpler architectural part in the circuit-design descriptions developed in gate-level, or deletes the original information parts from the circuit-design descriptions developed in gate-level at step ST30. At this stage, accompanied is the deletion of the information part describing the input terminal of the bus port corresponding to the intermediate bit connected to the redundant gate.

Furthermore, at step ST31, the logic synthesis device 1 produces a gate-level net-list wherein the bus port involving the deleted input terminal(s) is divided into a plurality of bus ports at the deleted input terminal(s), and other input terminals are assigned to the separated bus ports. Proceedings at steps ST30 and ST31 will be described in detail later. After step ST31, the process proceeds to step ST24 wherein the logic synthesis device 1 records the gate-level net-list without redundancy in the storage 2, and then the process ends.

Referring now to FIGS. 12A and 12B, the proceedings at steps ST28 and ST29 (FIG. 11) by the logic optimization device according to the fifth embodiment of the present invention will be described in more detail. In FIGS. 12A and 12B, reference numeral 80 designates a block at a layer in an end-product hierarchical integrated circuit.

Another block 81 is located at the nearest layer beneath the layer where the block 80 is located. The block 81 is provided with two input bus ports X and Y, wherein the bus port X includes a plurality of input terminals X[3] through X[0] while the bus port Y also includes a plurality of input terminals Y[3] through Y[0]. Symbols G11 denotes an AND gate located at the block 81 while G12 designate a NOR gate located at the block 81. IN80X3 and IN80Y0 denote input terminals at the upper layer block 80.

FIG. 12A illustrates a hierarchical integrated circuit based on a gate-level net-list prepared on the basis of RTL circuit-design descriptions representing multiple layers of the circuit, without a modification process of the fifth embodiment. The bus ports X and Y are located at the block 81, which is lower than the block 80. As shown in FIG. 12A, the bus port X includes four input terminals X[3] through X[0] while bus port Y also includes four input terminals Y[3] through Y[0]. Symbols "X" and "Y" for the input terminals represent, for example, different uses of the input terminals. The bus port X including the input terminals X[3] through X[0] may have a different use of that of the bus port Y including the input terminals Y[3] through Y[0].

The bus ports X and Y correspond to parallel buses connecting the block 81 and the upper layer block 80. If all input terminals X[3] through X[0] are connected with the block 80 via lines, the bus constituted of the lines may be used for a 4-bit bus. Similarly, if all input terminals Y[3] through Y[0] are connected with the block 80 via lines, the bus constituted of the lines may be also used for a 4-bit bus.

As illustrated in FIG. 12A, the input terminals X[3] and Y[0] are connected with input terminals IN80X3 and IN80Y0, respectively, at the upper layer block 80. Although not illustrated, the other input terminals X[2] through X[0] and Y[3] through Y[1] are also connected with input terminals of the block 80, respectively. The input terminals X[3] and X[2] are connected with both input terminals of the AND gate G11, respectively. The input terminals Y[1] and Y[0] are connected with both input terminals of the NOR gate G12, respectively.

In this architecture, the input terminals X[2] through X[0] and Y[3] through Y[1] are provided with variable inputs from input terminals (not shown) of the block 80 while the input terminal X[3] corresponding to the most significant bit among the input terminals X[3] through X[0] of the bus port X receives a fixed input "one" from the input terminal IN80X3 of the block 80. In this case, since an input terminal of the AND gate G11 is provided with a constant input "one," the AND gate G11 will output the same value as that is supplied via the input terminal X[2]. Accordingly, the AND gate G11 is unnecessary.

In addition, the input terminal Y[0] corresponding to the least significant bit among the input terminals Y[3] through Y[0] of the bus port Y receives a fixed input "zero" from the input terminal IN80Y0 of the block 80. In this case, since an input terminal of the NOR gate G12 is provided with a constant input "zero," the NOR gate G12 will output the inverted values of input values supplied via the input terminal Y[1]. Consequently, if "zero" is input into the input terminal Y[1], the NOR gate G12 outputs "one." If "one" is input into the input terminal Y[1], the NOR gate G12 outputs "zero." Accordingly, NOR gate G12 may be replaced with an inverter.

FIG. 12B shows a hierarchical integrated circuit based on a gate-level net-list prepared by the logic synthesis device 1 of the fifth embodiment on the basis of the same RTL circuit-design descriptions that are the bases of FIG. 12A. The unnecessary AND gate G11 may be deleted from the block 81. However, the AND gate G11 is replaced with a buffer G13 and the input terminal of the buffer G13 is connected with the input terminal X[2] according to the illustrated embodiment. Furthermore, removed are the input terminal X[3] and the input terminal IN80X3 that have thus become unnecessary. More exactly, the logic synthesis device 1 deletes the information parts describing the input terminal X[3], input terminal IN80X3, and AND gate G11 from the circuit-design descriptions developed in gate-level; and adds an information part describing the buffer G13 connected with the input terminal X[2].

In addition, the NOR gate G12 is replaced with a NOT gate G14, and the input terminal thereof is connected with the input terminal Y[1]. Then, removed are the input terminal Y[0] and the input terminal IN80Y0, which have thus become unnecessary. More exactly, the logic synthesis device 1 deletes the information parts describing the input terminal Y[0], input terminal IN80Y0, and NOR gate G12 from the circuit-design descriptions developed in gate-level; and adds an information part describing the NOT gate G14 connected with the input terminal Y[1].

Thereafter, the logic synthesis device 1 produces a gate-level net-list wherein the name of the bus ports X and Y are maintained unchanged, but the bus width of each bus is decreased for the deleted input terminals. This stage is step ST29 in FIG. 11. More specifically, as to the bus port X, the bus width of four bits corresponding to the input terminals X[3] through X[0] is decreased to three bits corresponding to the input terminal X[2] through X[0]. As to the bus port Y, the bus width of four bits corresponding to the input terminals Y[3] through Y[0] is decreased to three bits corresponding to the input terminal Y[2] through Y[0]. At this stage, in the circuit-design description, while names of the input terminals of the bus port X are maintained unchanged, the logic synthesis device 1 changes names of the remaining input terminals of the bus port Y: from Y[3] to Y[2], Y[2] to Y[1], and Y[1] to Y[0]. Thus, although unnecessary input terminals are deleted, the names of remaining input terminals of bus ports are prevented from being incoherent.

Figure 13B:
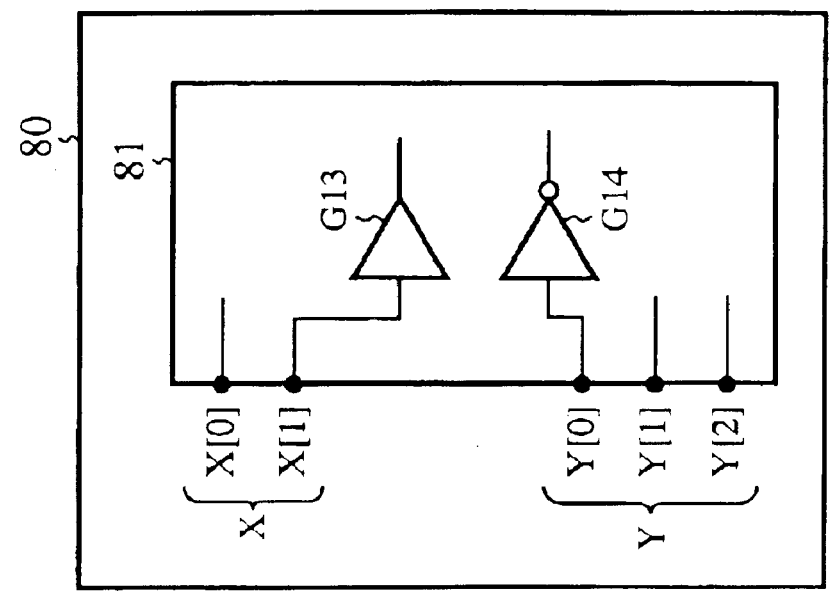
FIG. 13B is a diagram of a hierarchical integrated circuit based on a gate-level net-list prepared by the logic optimization device of the fifth embodiment on the basis of the same circuit-design descriptions in RTL that are the bases of FIG. 13A.
Figure 13A:
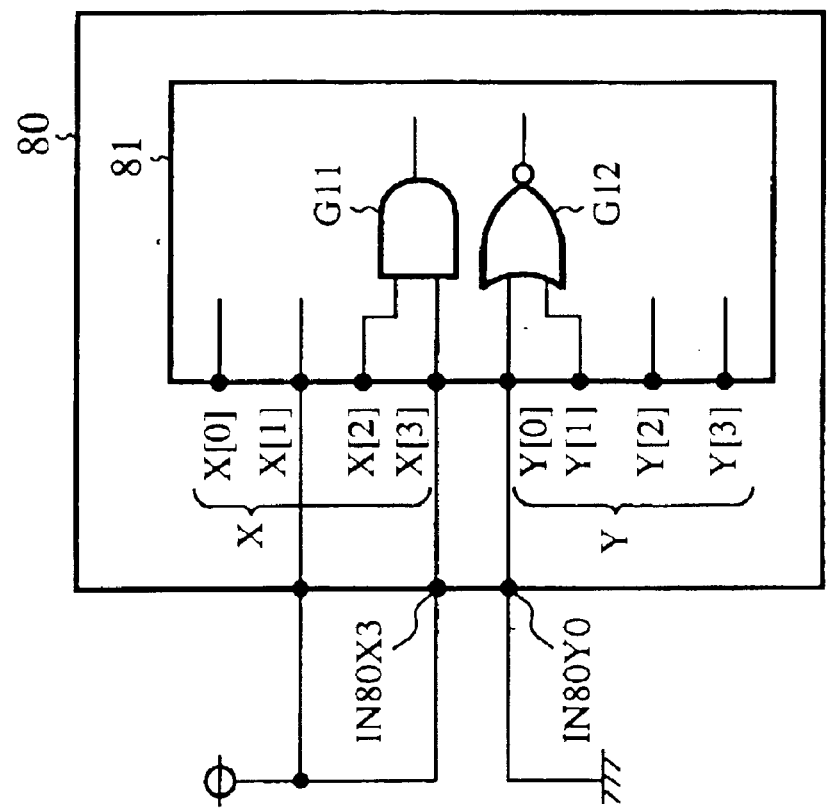
FIG. 13A is a diagram of a hierarchical integrated circuit based on a gate-level net-list prepared on the basis of circuit-design descriptions representing multiple layers of the circuit in RTL, without a modification process of the fifth embodiment.

The logic synthesis device 1 may decide whether or not there are a plurality of input terminals of a bus port that receives constant inputs and thus can be deleted, and may delete the information parts describing such input terminals of the bus port if the decision is affirmative. For example, as shown in FIGS. 13A and 13B, if the input terminal X[1] is unnecessary in addition to the input terminal X[3] at the bus port X before the modification proceeding, the logic synthesis device 1 may delete the original information parts describing the input terminals X[3] and X[1] from the circuit-design descriptions developed in gate-level, and may decrease the bus width of four bits corresponding to the input terminals X[3] through X[0] to two bits corresponding to the input terminals X[1] and X[0]. At this stage, the logic synthesis device 1 may change the name of the remaining input terminal of the bus port B: from X[2] to X[1].

Figure 14B:
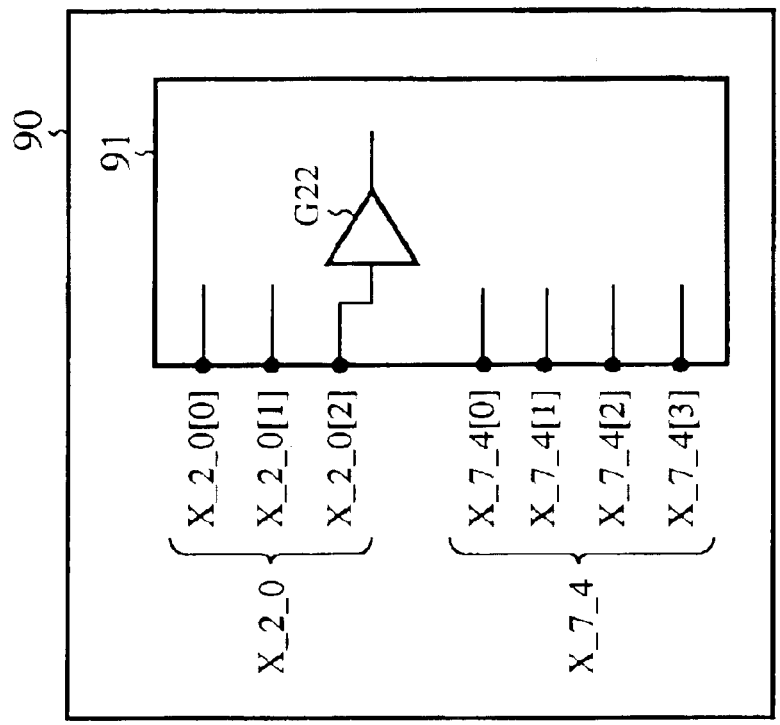
FIG. 14B is a diagram of a hierarchical integrated circuit based on a gate-level net-list prepared by the logic optimization device of the fifth embodiment on the basis of the same circuit-design descriptions in RTL that are the bases of FIG. 14A.
Figure 14A:
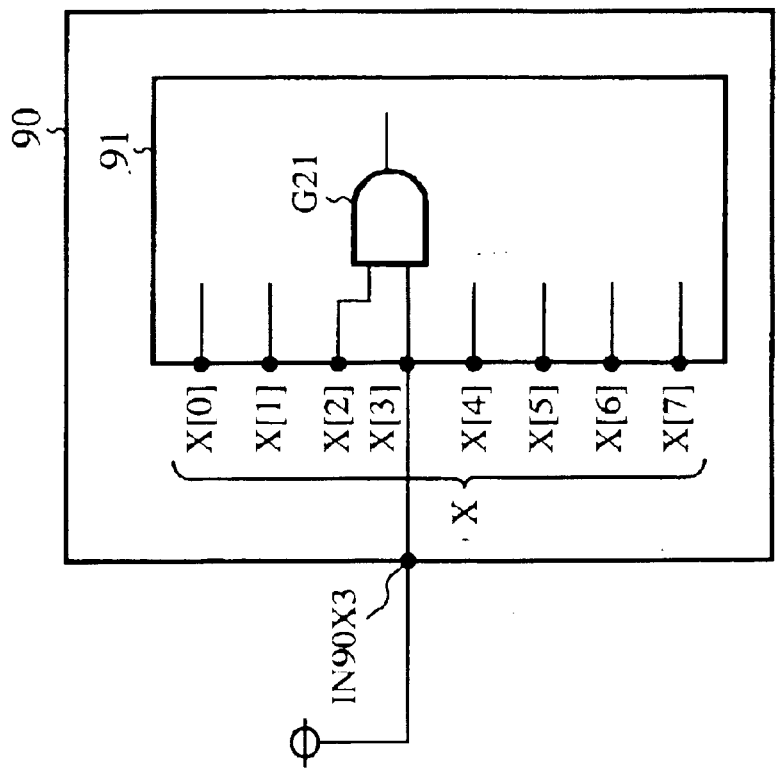
FIG. 14A is a diagram of another hierarchical integrated circuit based on a gate-level net-list prepared on the basis of other circuit-design descriptions representing multiple layers of the circuit in RTL, without a modification process of the fifth embodiment.

Referring now to FIGS. 14A and 14B, the proceedings at steps ST30 and ST31 (FIG. 11) by the logic optimization device according to the fifth embodiment of the present invention will be described in more detail. In FIGS. 14A and 14B, reference numeral 90 designates a block at a layer in an end-product hierarchical integrated circuit.

Another block 91 is located at the nearest layer beneath the layer where the block 90 is located. The block 91 is provided with an input bus port X, wherein the bus port X includes a plurality of input terminals X[7] through X[0]. Symbol G21 denotes an AND gate located at the block 91 while IN90X3 denotes an input terminal at the upper layer block 90.

FIG. 14A illustrates a hierarchical integrated circuit based on a gate-level net-list prepared on the basis of RTL circuit-design descriptions representing multiple layers of the circuit, without the modification process of the fifth embodiment. The bus port X is located at the block 91, which is lower than the block 90. As shown in FIG. 14A, the bus port X includes eight input terminals X[7] through X[0].

The bus port X corresponds to a parallel bus connecting the block 91 and the upper layer block 90. If all input terminals X[7] through X[0] are connected with the block 90 via lines, the bus constituted of the lines is used for an 8-bit bus.

As illustrated, the input terminal X[3] is connected with an input terminal IN90X3 at the upper layer block 90 while the other input terminals X[7] through X[4] and X[2] through X[0] are also connected with input terminals (not shown) at the block 90, respectively. The input terminal X[3] and X[2] are connected to both input terminals of the AND gate G21, respectively.

In this architecture, the input terminals X[7] through X[4] and X[2] through X[0] are provided with variable inputs from the input terminals (not shown) at the block 90. However, a fixed input "one" is always supplied to the input terminal X[3] corresponding to an intermediate bit of the bus port X from the input terminal IN90X3 of the block 90. In this case, since an input terminal of the AND gate G21 is provided with a constant input "one," the AND gate G21 will output the same value as that is supplied via the other input terminal of the AND gate G21 from the input terminal X[2]. Accordingly, the AND gate G21 is unnecessary.

FIG. 14B shows a hierarchical integrated circuit based on a gate-level net-list prepared by the logic synthesis device 1 of the fifth embodiment on the basis of the same RTL circuit-design descriptions that are the bases of FIG. 14A. In this embodiment, the unnecessary AND gate G21 may be deleted from the block 91. However, the AND gate G21 is replaced with a buffer G22 and the input terminal of the buffer G22 is connected with the input terminal X[2] according to the illustrated embodiment. Furthermore, removed are the input terminal X[3] and input terminal IN90X3, which have thus become unnecessary. More exactly, the logic synthesis device 1 deletes the information parts describing the input terminal X[3], input terminal IN90X3, and AND gate G21 from the circuit-design descriptions developed in gate-level; and adds an information part describing the buffer G22 connected with the input terminal X[2]. This stage corresponds to step ST30 of FIG. 11.

Furthermore, the logic synthesis device 1 produces a gate-level net-list wherein the bus port X involving the deleted input terminals X[3] is divided into two bus ports X_2_0 and X_7_4 at the deleted input terminal X[3], and other terminals X[7] through X[4] and X[2] through X[0] are assigned to the separated bus ports X_7_4 and X_2_0. The bus port X_2_0 is a 3-bit port wherein the input terminal X[2] in FIG. 14A is the most significant bit while the input terminal X[0] is the least significant bit. The bus port X_7_4 is a 4-bit port wherein the input terminal X[7] in FIG. 14A is the most significant bit while the input terminal X[4] is the least significant bit. This stage is step ST31 in FIG. 11.

On account of the bus port division, the logic synthesis device 1 changes the names of the input terminals as shown in FIG. 14B. More specifically, the names X[2] through X[0] are changed to X_2_0[2] through X_2_0[0] while names X[7] through X[4] are changed to X_7_4[3] through X_7_4[0]. Thus, although unnecessary input terminals are deleted, the names of remaining input terminals of bus ports are prevented from being incoherent. Furthermore, the names of input terminals can be changed easily and the previous names in the original circuit-design description can be readily assumed from the new names of the input terminals.

While the original bus port X is divided into two bus ports X_2_0 and X_7_4 in the above-described example, the bus port X may be divided into three or more bus ports in accordance with a similar manner if deleted are a plurality of input terminals corresponding to intermediate bits in the original bus port X.

As described above, by virtue of the fifth embodiment, it is possible to delete unnecessary elements at each layer of a hierarchical integrated circuit automatically, thereby producing a wasteless hierarchical gate-level net-list.

Sixth Embodiment.

Next, a logic optimization device according to a sixth embodiment of the present invention will be described. The structure of the logic optimization device according to the sixth embodiment may be also the same as that illustrated in FIG. 1.

Next, operations of the logic optimization device according to the sixth embodiment will be described. The logic synthesis device 1 (see FIG. 1) of the logic optimization device decides whether or not each element at each lower layer outputs a constant value while the logic synthesis device 1 carries out logic synthesis. If it is determined that a lower layer element outputs a constant value, the logic synthesis device 1 deletes the information part describing the output terminal of the lower layer element from the circuit-design descriptions. Furthermore, the logic synthesis device 1 replaces information parts describing an architectural part comprising elements at the upper layer connected with the output terminal by alternative information parts describing an equivalent or similar architectural part that is simpler than the original architectural part, thereby producing a gate-level net-list of the end-product integrated circuit without ineffectual elements. Alternatively, the logic synthesis device 1 may delete the original information parts describing such an architectural part, thereby producing a simple gate-level net-list of the end-product integrated circuit. The operations of the sixth embodiment may be incorporated with the above-described operations of the fourth or fifth embodiment.

Figure 15:
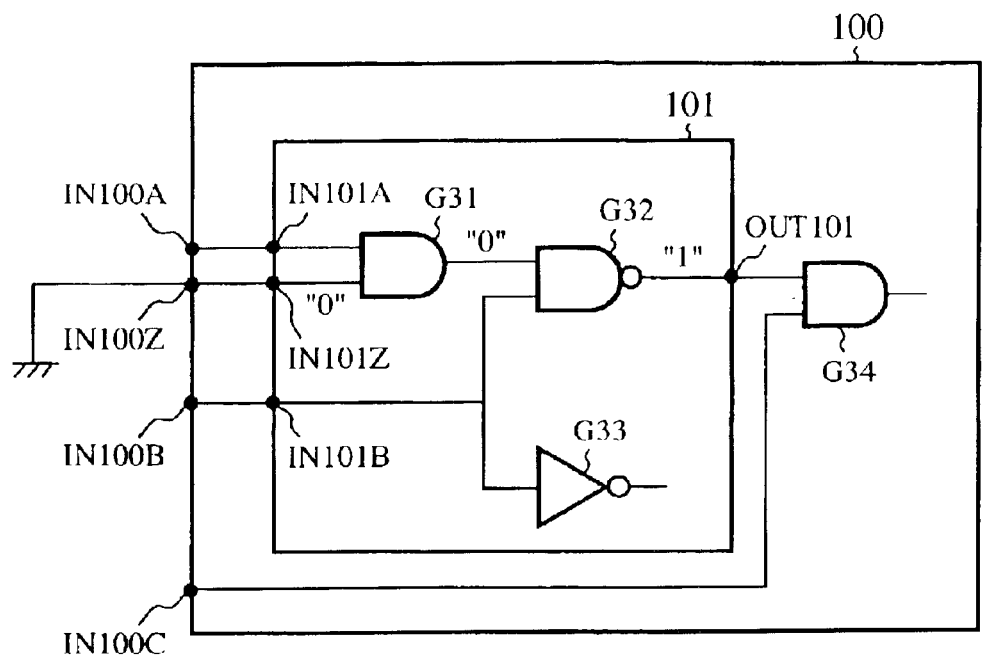
FIG. 15 is a diagram of another hierarchical integrated circuit based on a gate-level net-list prepared on the basis of other circuit-design descriptions representing multiple layers of the circuit in RTL, without a modification process of the sixth embodiment.
Figure 16:
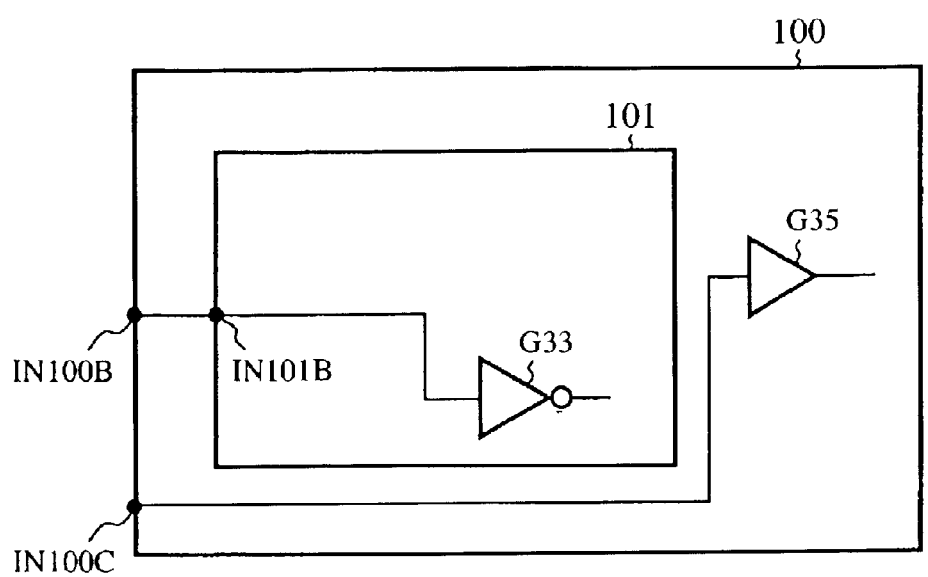
FIG. 16 is a diagram of a hierarchical integrated circuit based on a gate-level net-list prepared by the logic optimization device of the sixth embodiment on the basis of the same circuit-design descriptions in RTL that are the bases of FIG. 15.

Referring now to FIGS. 15 and 16, proceedings by the logic optimization device according to the sixth embodiment of the present invention will be described in more detail. In FIGS. 15 and 16, reference numeral 100 designates a block at a layer in an end-product hierarchical integrated circuit. Another block 101 is located at the nearest layer beneath the layer where the block 100 is located. Symbols G31, G32, and G33 designate an AND gate, a NAND gate, and a NOT gate, respectively, that are situated at the lower layer block 101. G34 denotes another AND gate located at the block 100. IN100A, IN100B, IN100C, and IN100Z denote input terminals at the block 100 while IN101A, IN101B, and IN101Z denote input terminals at the block 101. OUT101 denotes an output terminal at the block 101.

FIG. 15 illustrates a hierarchical integrated circuit based on a gate-level net-list prepared on the basis of RTL circuit-design descriptions representing multiple layers of the circuit, without a modification process of the sixth embodiment of the present invention. As shown in FIG. 15, there are an AND gate G31, a NAND gate G32, and a NOT gate G33 at block 101 existing at the lower layer than the block 100. This means that RTL circuit-design description for the layer of the block 101 provided for the logic synthesis describes that the block 101 has these gates G31 through G33.

The input terminals IN100A, IN100B, and IN100Z at the upper layer block 100 are connected respectively with the input terminals IN 101A, IN101B, and IN101Z at the lower layer block 101. The input terminal IN101A and IN101Z are connected to both input terminals of the AND gate G31 of which the output terminal is connected with an input terminal of the NAND gate G32. The input terminal IN101B is connected with the other input terminal of the NAND gate G32 and with the sole input terminal of the NOT gate G33.

The output terminal of the NOT gate G33 is connected with an element (not shown) at the upper layer block 100. The output terminal of the NAND gate G32 is connected with the output terminal OUT101 of the block 101 that is connected with an input terminal of the AND gate G34 at the upper layer block 100. The other input terminal of the AND gate G34 is directly connected with the input terminal IN100C.

In this architecture, the input terminals IN100A, IN100B, and IN100C are provided with variable inputs while the input terminal IN100Z always receives a fixed input "zero." In this case, irrespective of the variable input values to the input terminal IN100A, the output of the AND gate G31 must be "zero." Accordingly, the NAND gate G32, of which an input terminal is provided with the output of the AND gate G31, must output "one", irrespective of the input value via the input terminal IN100B. Furthermore, the AND gate G34, of which an input terminal is provided with the output of the NAND gate G32, will output the same value as that is supplied to the other input terminal of the AND gate G34 from the input terminal IN100C. As will be understood by the above description, the AND gate G31, NAND gate G32, and AND gate G34 are unnecessary.

FIG. 16 shows a hierarchical integrated circuit based on a gate-level net-list prepared by the logic synthesis device 1 of the sixth embodiment on the basis of the same RTL circuit-design descriptions that are the bases of FIG. 15. In this embodiment, as shown in FIG. 16, the unnecessary AND gate G31 and NAND gate G32 are removed from the block 101. Furthermore, the input terminals IN100A, IN100Z, IN101A, and IN101Z, and the output terminal OUT101, which are connected with the AND gate G31 or the NAND gate G32, are removed.

However, the NOT gate G33 and the input terminals IN100B and IN101B that are determined to be necessary are left. The unnecessary AND gate G34 may be deleted from the block 100. However, the AND gate G34 is replaced with a buffer G35 and the input terminal of the buffer G35 is connected with the input terminal IN100C according to the illustrated embodiment. More exactly, the logic synthesis device 1 deletes the information parts describing the AND gate G31, the NAND gate G32, the AND gate G34, and the terminals IN100A, IN100Z, IN101A, IN101Z, and OUT101 from the circuit-design descriptions developed in gate-level. The logic synthesis device 1 also adds an information part describing the buffer G35 connected with the input terminal IN100C instead of the AND gate G34. The logic synthesis device 1 produces a hierarchical gate-level net-list on the whole end-product integrated circuit in the above-mentioned manner. Accordingly, the volume and the area of the end-product circuit can be decreased.

As described above, by virtue of the sixth embodiment, it is possible to delete unnecessary elements at each layer of a hierarchical integrated circuit automatically, thereby producing a wasteless hierarchical gate-level net-list.

In the above-described sixth embodiment, when it is determined that an element at the lower layer block 101 outputs a constant value, the information part describing the output terminal of the element are deleted from the circuit-design description and the information parts describing the architectural part comprising elements in the "upper layer" connected with the output terminal are deleted or replaced. In connection with the sixth embodiment, the phrase "upper layer" is not intended to be limited to the nearest upper layer for the lower layer, and rather it is intended to cover still upper layers.

While the present invention has been particularly shown and described with references to preferred embodiments thereof, it will be understood by those skilled in the art that various changes in form and details may be made therein without departing from the spirit and scope of the invention as defined by the claims. Such variations, alterations, and modifications are intended to be encompassed in the scope of the claims.

For example, according to each of the above-described embodiments, the logic synthesis device that develops RTL circuit-design descriptions into gate-level modifies various information elements. However, another type of logic synthesis device that unites a plurality of gate-level net-lists may modify various information elements.

What is claimed is:

1. A logic optimization device comprising:
   a decider for referring to hierarchical circuit-design descriptions representing multiple layers of an integrated circuit, and for deciding whether or not each output terminal at each lower layer is connected with its upper layer;

a modifier for deleting from the hierarchical circuit-design descriptions an information part describing an output terminal at a lower layer that has been decided to be unconnected with its upper layer by the decider, and for deleting from the hierarchical circuit-design descriptions an information cart describing an element at the lower layer connected with the output terminal, thereby producing a gate-level net-list of an integrated circuit; and a second decider for deciding whether or not each output terminal, which has been decided to be unconnected with its upper layer by the decider, corresponds to the most significant or the least significant bit of a bus port having a name and a bus width, wherein the modifier deletes an information part describing an output terminal and produces a gate-level net-list where the name of the bus port is not changed, but the bus width is decreased for the deleted output terminal if the second decider has decided the output terminal corresponds to the most significant or the least significant bit of a bus port.

2. The logic optimization device according to claim 1, wherein if the second decider has decided that a plurality of output terminals unconnected with their upper layer correspond to consecutive bits including the most significant or least significant bit of a bus port, the modifier deletes information parts describing the plurality of output terminals and produces a gate-level net-list where the name of the bus port is not changed, but the bus width is decreased for the deleted output terminals.

3. A logic optimization device comprising:

a decider for referring to hierarchical circuit-design descriptions representing multiple layers of an integrated circuit, and for deciding whether or not each output terminal at each lower layer is connected with its upper layer;

a modifier for deleting from the hierarchical circuit-design descriptions an information part describing an output terminal at a lower layer that has been decided to be unconnected with its upper layer by the decider, and for deleting from the hierarchical circuit-design descriptions an information part describing an element at the lower layer connected with the output terminal, thereby producing a gate-level net-list of an integrated circuit; and a second decider for deciding whether or not each output terminal, which has been decided to be unconnected with its upper layer by the decider, corresponds to the most significant or the least significant bit of a bus port, wherein the modifier deletes an information part describing an output terminal and produces a gate-level net-list where an original bus port involving the deleted output terminal is divided into a plurality of separated bus ports at the deleted output terminal, and other output terminals of the original bus port are assigned to the separated bus ports if the second decider has decided that the output terminal corresponds to an intermediate bit other than the most significant or the least significant bit of a bus port.

4. A logic optimization device comprising:

a decider for referring to hierarchical circuit-design descriptions representing multiple layers of an integrated circuit, and for deciding whether or not each output terminal at each lower layer is connected with its upper layer; and a modifier for deleting from the hierarchical circuit-design descriptions an information part describing an output terminal at a lower layer that has been decided to be unconnected with its upper layer by the decider, and for deleting from the hierarchical circuit-design descriptions an information part describing an element at the lower layer connected with the output terminal, thereby producing a gate-level net-list of an integrated circuit;

wherein the decider decides whether or not each output terminal at each lower layer is connected with its secondary upper layer that is still upper than the upper layer although each output terminal is connected with its upper layer, and wherein the modifier deletes an information part describing an output terminal at a lower layer that has been decided to be unconnected with its secondary upper layer by the decider, and deletes an information part describing an element at the upper layer connected with the output terminal at the lower layer.

5. A logic optimization device comprising:

a decider for referring to hierarchical circuit-design descriptions representing multiple layers of an integrated circuit, and deciding whether or not each gate at each lower layer receives a fixed input from its upper layer; and a modifier for replacing in the hierarchical circuit-design descriptions information parts describing an original architectural part comprising elements at a lower layer including a gate that has been decided to receive a fixed input by the decider and elements at its upper layer connected to an input terminal of the gate by alternative information parts describing an equivalent architectural part that is simpler than the original architectural part, or for deleting from the hierarchical circuit-design descriptions information parts describing the original architectural part, thereby producing a gate-level net-list of an integrated circuit.

6. The logic optimization device according to claim 5, further comprising a second decider for deciding whether or not an input terminal of each gate, which has been decided to receive a fixed input by the decider, is connected with an input terminal corresponding to the most significant or the least significant bit of a bus port having a name and a bus width, wherein the modifier deletes an information part describing an input terminal of a bus port and produces a gate-level net-list where the name of the bus port is not changed, but the bus width is decreased for the deleted input terminal if the second decider has decided that an input terminal of a gate is connected with the input terminal corresponding to the most significant or the least significant bit of the bus port.

7. The logic optimization device according to claim 6, wherein the second decider decides whether or not a plurality of input terminals of a bus port receive fixed inputs, and wherein the modifier deletes information parts describing a plurality of input terminals of a bus port and produces a gate-level net-list where the name of the bus port is not changed, but the bus width is decreased for the deleted input terminals if the second decider has decided the plurality of input terminals of the bus port receive fixed inputs.

8. The logic optimization device according to claim 5, further comprising a second decider for deciding whether or not an input terminal of each gate, which has been decided to receive a fixed input by the decider, is connected with an input terminal corresponding to the mostsignificant or the least significant bit of a bus port, wherein the modifier deletes an information part describing an input terminal of a bus port and produces a gate-level net-list where an original bus port involving the deleted input terminal is divided into a plurality of separated bus ports at the deleted input terminal, and other input terminals of the original bus port are assigned to the separated bus ports if the second decider has decided that the input terminal corresponds to an intermediate bit other than the most significant or the least significant bit of the bus port.

9. The logic optimization device according to claim 5, wherein the decider decides whether or not each element at each lower layer outputs a fixed value, and wherein the modifier deletes an information part describing an output terminal of an element that has been decided to output a fixed value by the decider and replaces in the circuit-design descriptions information parts describing an original architectural part comprising elements at the upper layer connected with the deleted output terminal by alternative information parts describing an equivalent architectural part that is simpler than the original architectural part, or deletes from the hierarchical circuit-design descriptions information parts describing the original architectural part, thereby producing a gate-level net-list of an integrated circuit.

* * * * *